US006710682B2

(12) United States Patent
Onishi et al.

(10) Patent No.: US 6,710,682 B2
(45) Date of Patent: Mar. 23, 2004

(54) SURFACE ACOUSTIC WAVE DEVICE, METHOD FOR PRODUCING THE SAME, AND CIRCUIT MODULE USING THE SAME

(75) Inventors: Keiji Onishi, Settsu (JP); Akihiro Nanba, Osaka (JP); Hiroki Sato, Moriguchi (JP); Katsunori Moritoki, Takatsuki (JP); Yoshihiro Bessho, Higashiosaka (JP); Kunihiro Fujii, Hirakata (JP); Kouzou Murakami, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/971,102

(22) Filed: Oct. 3, 2001

(65) Prior Publication Data

US 2002/0101304 A1 Aug. 1, 2002

(30) Foreign Application Priority Data

| Oct. 4, 2000 | (JP) | 2000-304788 |
| Dec. 28, 2000 | (JP) | 2000-402871 |

(51) Int. Cl.⁷ .............................. H03H 9/64; H03H 3/08
(52) U.S. Cl. ................... 333/193; 310/313 B; 29/25.35
(58) Field of Search ................ 333/193–196; 310/313 R, 313 B, 313 C, 313 D; 29/25.35

(56) References Cited

U.S. PATENT DOCUMENTS

| 5,459,368 | A | * | 10/1995 | Onishi et al. | ............ 310/313 R |
| 5,699,027 | A | * | 12/1997 | Tsuji et al. | ................... 333/193 |
| 5,920,142 | A | * | 7/1999 | Onishi et al. | ............ 310/313 R |
| 5,991,989 | A | * | 11/1999 | Onishi et al. | ............... 29/25.35 |
| 6,078,123 | A | * | 6/2000 | Tanaka et al. | .......... 310/313 R |
| 6,078,229 | A | | 6/2000 | Funada et al. | ............... 333/193 |

FOREIGN PATENT DOCUMENTS

| EP | 896 427 | | 2/1999 |
| EP | 0939 485 | * | 9/1999 |
| GB | 2 340 300 | * | 2/2000 |
| JP | 5-55303 | | 3/1993 |
| JP | 9-162693 | | 6/1997 |
| JP | 11-55066 | | 2/1999 |
| JP | 11-68505 | * | 3/1999 |
| JP | 11-251866 | * | 9/1999 |
| JP | 2000-124767 | | 4/2000 |

* cited by examiner

*Primary Examiner*—Barbara Summons
(74) *Attorney, Agent, or Firm*—Merchant & Gould P.C.

(57) ABSTRACT

A surface acoustic wave device of the present invention includes a piezoelectric substrate, a plurality of comb electrodes for exciting a surface acoustic wave, disposed on a principal plane of the piezoelectric substrate, a plurality of bumps disposed on the principal plane, and an insulating sheet disposed so as to be opposed to the principal plane, wherein the bumps and the comb electrodes are connected electrically to each other, and the bumps penetrate through the insulating sheet.

33 Claims, 34 Drawing Sheets

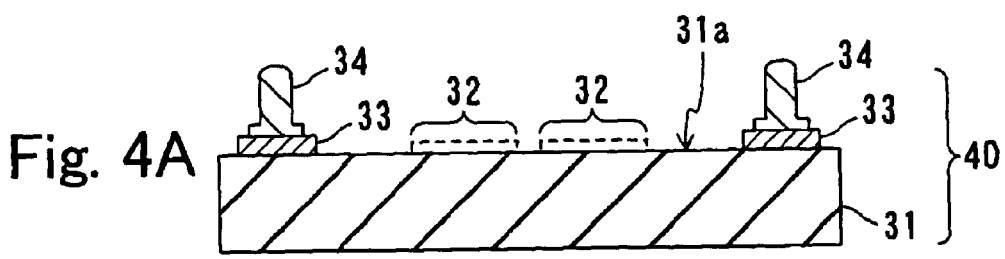
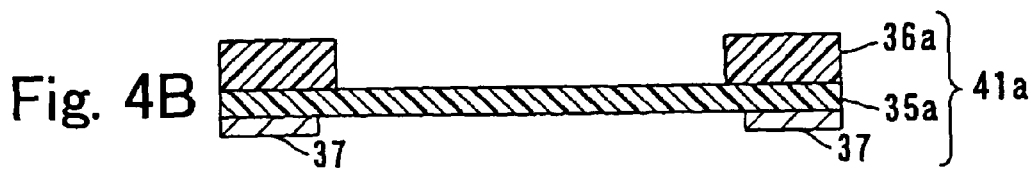
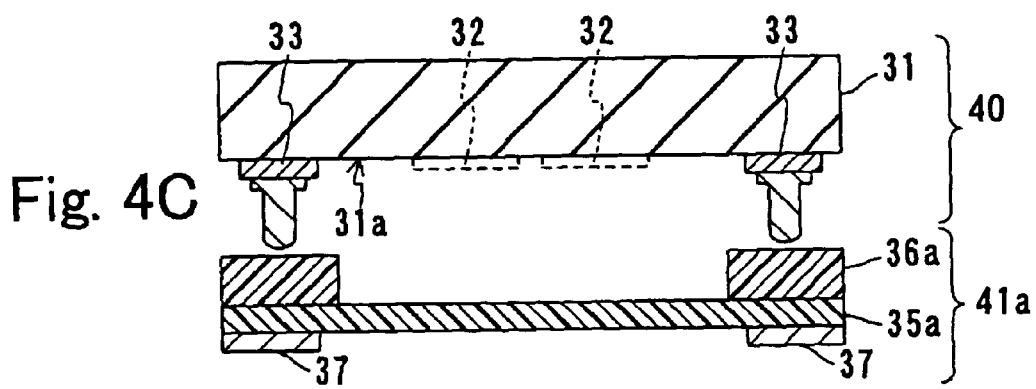
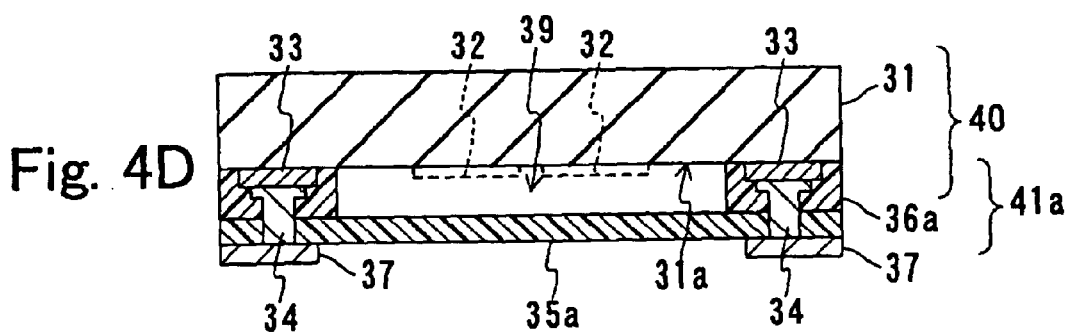
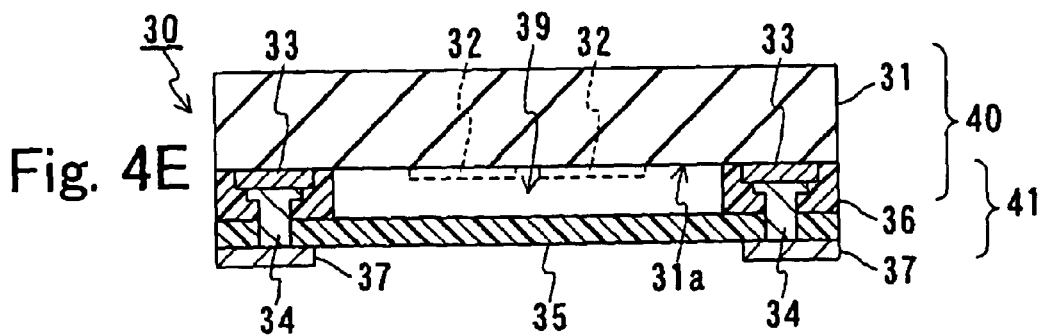

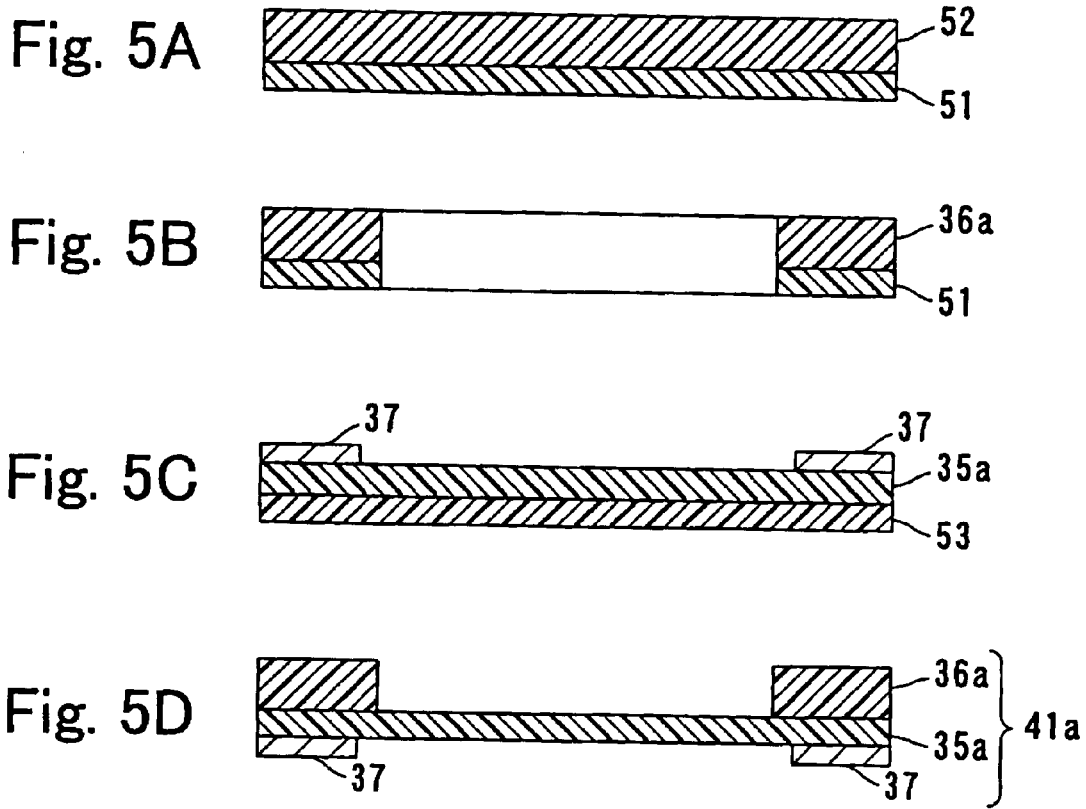

SURFACE ACOUSTIC WAVE DEVICE, METHOD FOR PRODUCING THE SAME, AND CIRCUIT MODULE USING THE SAME

BACKGROUND OF THE INVENTION

1. Field of the Invention

The present invention relates to a surface acoustic wave device, a method for producing the same, and a circuit module using the same.

2. Description of the Related Art

Recently, communication equipment such as a mobile phone is being miniaturized and reduced in size rapidly. Along with this, there is a demand for miniaturization of a surface acoustic wave device (hereinafter, which may be referred to as a "SAW device") such as a filter and a resonator mounted on communication equipment. There also is a demand for miniaturization of the space required for setting a SAW device.

FIG. 38 schematically shows a cross-sectional view (hatching is omitted) of a SAW device 900 as a representative example of a conventional SAW device. The SAW device 900 includes a piezoelectric substrate 901, comb electrodes (alternatively called inter-digital transducers) 902 and electrode pads 903 formed on the piezoelectric substrate 901, wires 904, electrode pads 905, internal electrodes 906, external electrodes 907, a layered ceramic substrate 908 composed of a layered body of ceramic substrates 908a, 908b, and 908c, and a cover portion 909.

The comb electrodes 902 excite a surface acoustic wave. The comb electrodes 902 are connected electrically to the electrode pads 903 via wiring lines (not shown) formed on the piezoelectric substrate 901. The comb electrodes 902 are connected electrically to the external electrodes 907 via the electrode pads 903, the wires 904, the electrode pads 905, and the internal electrodes 906. In the SAW device, it is required to form an enclosed space around the comb electrodes 902 for the purpose of ensuring propagation of a surface acoustic wave. In the SAW device 900, the layered ceramic substrate 908 and the cover portion 909 form an enclosed space.

However, in the SAW device 900, it is required to form wires 904 three-dimensionally, and enlarge the electrode pads 903 and 905 for wire bonding. Therefore, such a configuration of the SAW device 900 hinders miniaturization thereof. Furthermore, in the SAW device 900, a parasitic inductance caused by the wires 904 is large.

In order to solve the above-mentioned problems, a method for mounting a SAW element provided with the piezoelectric substrate 901, the comb electrodes 902, and the electrode pads 903 onto a substrate by a facedown technique has been reported (see JP 5(1993)-55303 A). FIG. 39 schematically shows a cross-sectional view (partial hatching is omitted) of a SAW device 950 as an example of such a SAW device. The SAW device 950 includes a piezoelectric substrate 901, comb electrodes 902 and electrode pads 903 formed on the piezoelectric substrate 901, bumps 951, electrode pads 952, internal electrodes 953, external electrodes 954, a substrate 955, dams 956, and a resin film 957.

The comb electrodes 902 are connected electrically to the external electrodes 954 via the electrode pads 903, the bumps 951, the electrode pads 952, and the internal electrodes 953. On the periphery of the comb electrodes 902, an enclosed space is provided by the resin film 957 formed so as to cover the piezoelectric substrate 901. The dams 956 prevent resin from flowing into the enclosed space when the resin film 957 is formed. In the SAW device 950, a SAW element is mounted on the substrate 955 by a face-down technique, so that the SAW device in this example is more likely to be miniaturized compared with the SAW device 900.

There also is a method for mounting a SAW element in an air-tight container of the SAW device 900 by a face-down technique.

However, the SAW device 905 has the following problems. In order to produce the SAW device 950, it is required to form the electrode pads 952, the internal electrodes 953, and the external electrodes 954 on the surface of and inside the substrate 955. During this process, if the substrate 955 is thin, the substrate 955 may be warped or damaged. This makes it difficult to make the substrate 955 thin, resulting in insufficient miniaturization of an apparatus.

Furthermore, in the course of producing the SAW device 950, the dams 956 prevent the resin to be the resin film 957 from flowing into the enclosed space. This requires that mounting is conducted while the interval between the piezoelectric substrate 901 and the substrate 955 is regulated with high precision. If the bumps 951, the electrode pads 952, and the internal electrodes 953 are mounted so as to be positioned in a line, it is difficult to conduct mounting with high precision. This is because the material for the internal electrode 953 is different from that for the substrate 955. Therefore, in the SAW device 950, the bumps 951 and the internal electrodes 953 are disposed so as to be shifted from each other, which makes it difficult to achieve sufficient miniaturization.

Furthermore, with a device in which a SAW element is mounted in an air-tight container of the SAW device 900 by a face-down technique, an airtight container capable of accommodating the SAW device is required. Therefore, even with such a device, sufficient miniaturization is difficult.

SUMMARY OF THE INVENTION

Therefore, with the foregoing in mind, it is an object of the present invention to provide a SAW device capable of being further miniaturized compared with a conventional SAW device, and a method for producing the same.

In order to achieve the above-mentioned object, a surface acoustic wave device of the present invention includes: a piezoelectric substrate; a plurality of comb electrodes for exciting a surface acoustic wave, disposed on a principal plane of the piezoelectric substrate; a plurality of bumps disposed on the principal plane; and a member containing resin, disposed on the principal plane side, wherein the bumps and the comb electrodes are connected electrically to each other, and at least a part of the bumps is buried in the member. The surface acoustic wave device of the present invention can be used, for example, for a frequency filter and a resonator mounted in communication equipment.

In the above-mentioned surface acoustic wave device, the member may be an insulating sheet, the insulating sheet may be disposed away from the comb electrodes, and the bumps may penetrate through the insulating sheet.

The above-mentioned surface acoustic wave device further includes a circuit board disposed so as to be opposed to the principal plane of the piezoelectric substrate, wherein the circuit board includes wiring lines formed on a surface on the piezoelectric substrate side, the member is disposed between the piezoelectric substrate and the circuit board, and the member is a space forming member for forming a space that allows the comb electrodes to vibrate on a periphery of the comb electrodes.

Furthermore, a first method for producing a surface acoustic wave device of the present invention includes the steps of: (a) forming a plurality of comb electrodes for exciting a surface acoustic wave and bumps connected electrically to the comb electrodes on a principal plane of a piezoelectric substrate; and (b) opposing the principal plane of the piezoelectric substrate to an insulating sheet, and bringing the piezoelectric substrate and the insulating sheet closer together so that the bumps penetrate through the insulating sheet.

Furthermore, a second method for producing a surface acoustic wave device of the present invention includes the steps of: (i) forming a piezoelectric substrate, a plurality of comb electrodes formed on a principal plane of the piezoelectric substrate, a surface acoustic wave element including a plurality of bumps connected electrically to the plurality of comb electrodes, and a circuit board having a principal plane on which wiring lines are formed; (ii) disposing the principal plane of the piezoelectric substrate and the principal plane of the circuit board so that they are opposed to each other with a space forming member interposed therebetween; and (iii) bringing the circuit board and the surface acoustic wave element closer together so that the bumps are buried in the space forming member to be connected electrically to the wiring lines. In the step (iii), the space forming member forms a space allowing the comb electrodes to vibrate on a periphery of the comb electrodes.

Furthermore, a circuit module of the present invention includes a circuit board, a surface acoustic wave device, and a functional element, wherein the circuit board includes wiring lines formed on a principal plane thereof, the surface acoustic wave device and the functional element are mounted on the wiring lines, the surface acoustic wave device includes a piezoelectric substrate, a plurality of comb electrodes for exciting a surface acoustic wave disposed on a principal plane of the piezoelectric substrate, a plurality of bumps disposed on the principal plane of the piezoelectric substrate, and a member containing resin disposed on a side of the principal plane of the piezoelectric substrate, wherein the bumps and the comb electrodes are connected electrically to each other, and at least a part of the bumps is buried in the member.

In a circuit module of the present invention, the member may be an insulating sheet, the insulating sheet may be disposed away from the comb electrodes, and the bumps may penetrate through the insulating sheet.

In a circuit module of the present invention, the member may be disposed between the piezoelectric substrate and the circuit board, and the member may be a space forming member for forming a space that allows the comb electrodes to vibrate on a periphery of the comb electrodes.

The SAW device of the present invention can be further miniaturized compared with a conventional SAW device, and reduction in cost and enhancement of reliability can be realized. The SAW device of the present invention can be used, for example, for a frequency filter and a resonator mounted in communication equipment.

Furthermore, according to the production method of a SAW device of the present invention, the SAW device of the present invention can be produced easily.

These and other advantages of the present invention will become apparent to those skilled in the art upon reading and understanding the following detailed description with reference to the accompanying figures.

BRIEF DESCRIPTION OF THE DRAWINGS

FIGS. 4A to 4E are cross-sectional views showing an exemplary method for producing a SAW device of the present invention.

FIGS. 5A to 5D are cross-sectional views showing exemplary processes of producing a carrier in the production method shown in FIGS. 4A to 4E.

DESCRIPTION OF THE PREFERRED EMBODIMENTS

Figure 1A:
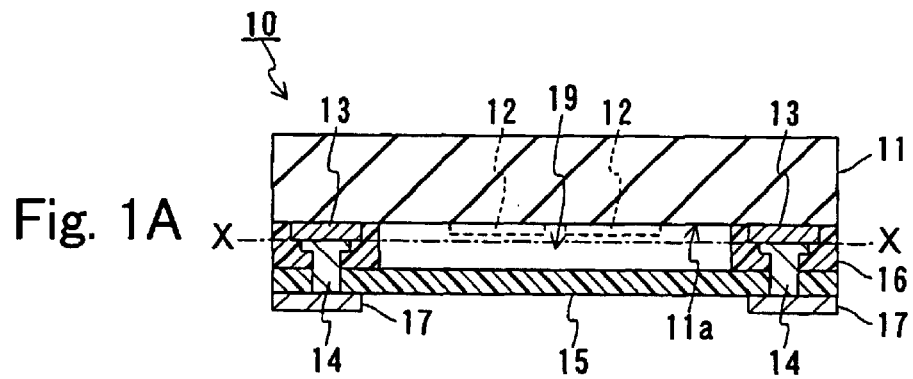
FIGS. 1A to 1C are cross-sectional views showing an exemplary SAW device of the present invention.

Hereinafter, the present invention will be described by way of illustrative embodiments with reference to the drawings. In the following description of the embodiments, like reference numerals denote like components, and the repeated description thereof may be omitted.

Embodiment 1

A surface acoustic wave (SAW) device of the present invention includes a piezoelectric substrate, a plurality of comb electrodes for exciting a surface acoustic wave disposed on a principal plane of the piezoelectric substrate, a plurality of bumps disposed on the principal plane, and a member containing resin disposed on the principal plane side. The bumps and the comb electrodes are connected electrically to each other. At least a part of the bumps is buried in the member.

In Embodiment 1, an example of the SAW device of the present invention will be described. In the SAW device of Embodiment 1, the member is an insulating sheet. The insulating sheet is disposed away from the comb electrodes. The bumps penetrate through the insulating sheet.

Figure 1B:
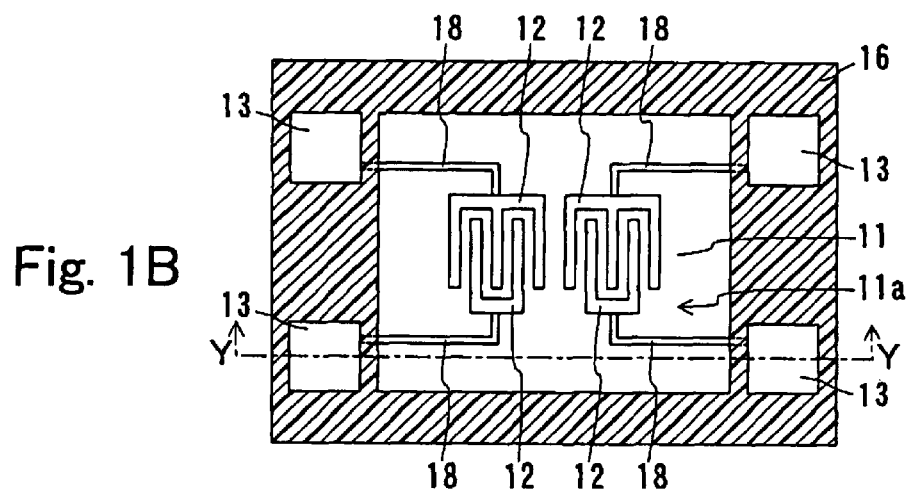
Figure 1C:
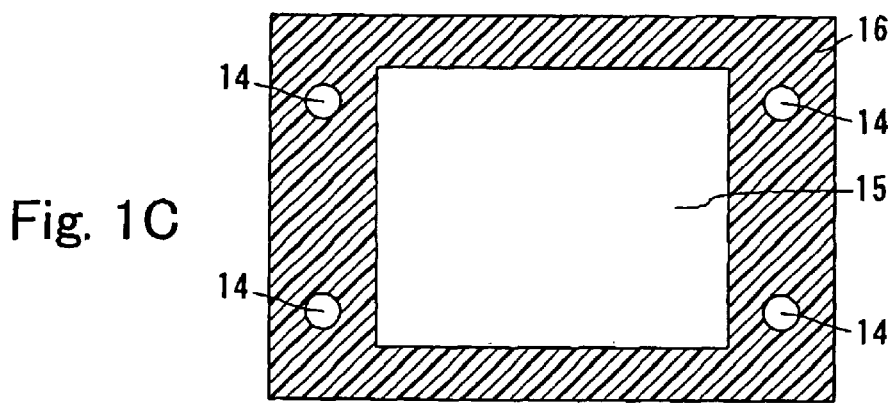

FIG. 1A is a cross-sectional view of a SAW device 10 of Embodiment 1. FIG. 1B is a cross-sectional view showing a piezoelectric substrate 11 side, taken along a line X—X in FIG. 1A. FIG. 1C is a cross-sectional view showing an insulating sheet 15 side, taken along the line X—X in FIG. 1A. The cross-sectional view of FIG. 1A is taken along a line Y—Y in FIG. 1B. In FIG. 1A, wiring lines 18 are not shown.

Referring to FIGS. 1A to 1C, the SAW device 10 includes the piezoelectric substrate 11 (hatching is omitted), a plurality of comb electrodes 12 disposed on a principal plane 11a of the piezoelectric substrate 11, a plurality of electrode pads 13 disposed on the principal plane 11a, a plurality of bumps 14 disposed on the principal plane 11a (specifically, the electrode pads 13), an insulating sheet 15 disposed so as to be opposed to the principal plane 11a, a side wall 16 disposed between the piezoelectric substrate 11 and the insulating sheet 15, external electrodes 17 formed on the insulating sheet 15, and wiring lines 18 disposed on the principal plane 11a.

Figure 2:
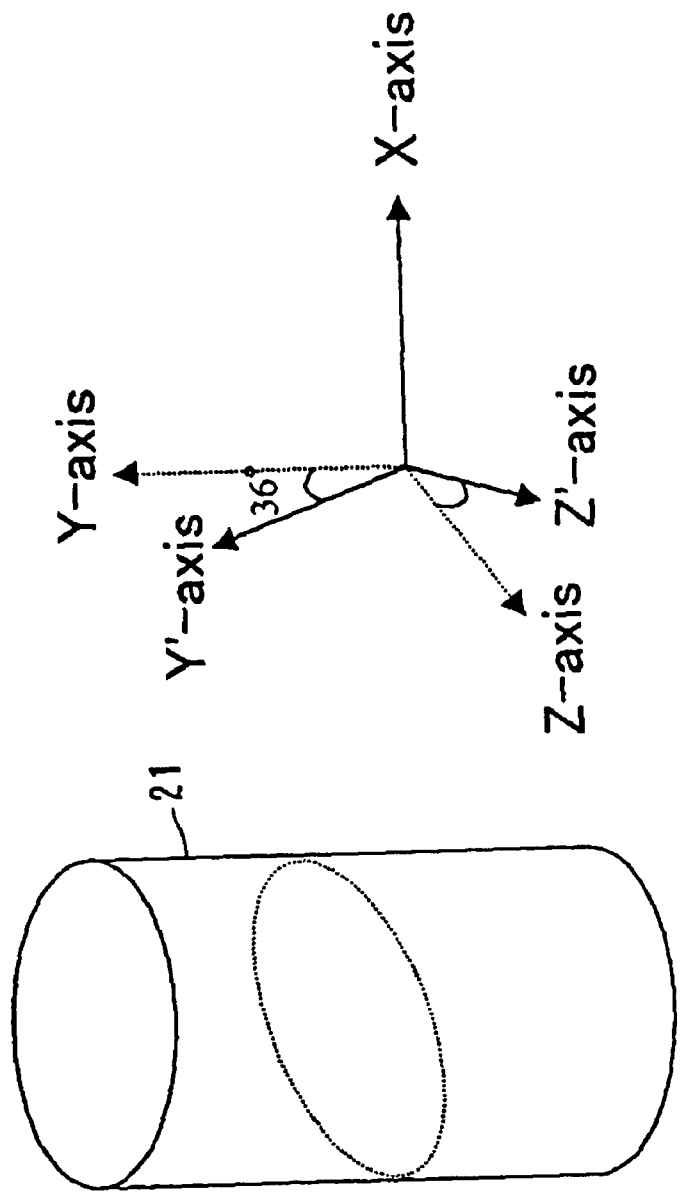
FIG. 2 is a view showing a cut angle of a 36° y-cut tantalum substrate.

The piezoelectric substrate 11 is made of a piezoelectric material. More specifically, a single crystal substrate made of a piezoelectric material, such as lithium tantalate, lithium niobate, quartz, potassium niobate, Langasite, and quartz can be used. For example, 36° y-cut lithium tantalate substrate can be used. Furthermore, a piezoelectric substrate with a thin film made of zinc oxide or aluminum nitride formed thereon is also used. Herein, a cut angle of the substrate will be described with reference to FIG. 2. FIG. 2 shows single crystal 21 of lithium tantalate, and a crystal axis of single crystal. The single crystal 21 is spontaneously polarized in a c-axis direction (i.e., a Z-axis direction). The 36° y-cut substrate refers to a substrate obtained by cutting single crystal 21 so that a Y'-axis obtained by rotating a Y-axis by 36° with respect to a rotation axis of an X-axis becomes a normal line direction. In FIG. 2, a cutting direction is represented by a dotted line.

There is no particular limit on the thickness of the piezoelectric substrate 11. In the SAW device 10, the piezoelectric substrate 11 can be made thin. For example, the thickness of the SAW device 10 can be set in a range of 0.05 mm to 0.3 mm.

The SAW device 10 further may include a film made of a silicon compound formed so as to cover the comb electrodes 12 on the principal plane 11a. Examples of the silicon compound include silicon oxide ($SiO_2$, $SiO$), and silicon nitride.

The comb electrodes 12 excite a surface acoustic wave. The comb electrodes 12 are made of, for example, aluminum, scandium, copper, or an alloy thereof. For example, an aluminum alloy containing 1 to 2% by weight of copper can be used. The comb electrodes 12 are disposed so that two comb electrodes 12 are opposed as a pair. Each comb electrode 12 is connected electrically to the external electrode 17 via the wiring line 18, the electrode pad 13, and the bump 14. In FIGS. 1A to 1C, each comb electrode 12 is shown to have 3 or 5 branch electrodes. Actually, the comb electrode 12 includes tens of branch electrodes. Furthermore, in Embodiment 1, two pairs of comb electrodes 12 are formed. However, the number of the comb electrodes is not limited thereto. In the case of using a SAW device as a filter, two pairs or more of comb electrodes generally are formed.

The electrode pads 13 are formed so as to connect the bumps 14 to the wiring lines 18. The electrode pads 13 may be made of copper, aluminum, gold, or an alloy thereof. For example, as the electrode pad 13, a layered film of an aluminum alloy film containing 1 to 2% by weight of copper and a gold thin film can be used. The thickness of the electrode pad 13 is, for example, about 1 $\mu$m to 3 $\mu$m.

The bumps 14 are made of a conductive material such as gold or solder. The diameter of each bump 14 is, for example, about 50 $\mu$m to 200 $\mu$m. The bumps 14 are connected electrically to the external electrodes 17 via the side wall 16 and the insulating sheet 15. As described in Embodiment 12, the bumps 14 may not penetrate through the side wall 16.

The insulating sheet 15 is made of an insulating material with low stiffness. More specifically, the insulating sheet 15 can be made of resin, for example, epoxy resin. The thickness of the insulating sheet 15 is, for example, about 0.02 mm to 0.2 mm. The insulating sheet 15 may contain a conductive solid filling disposed so as to be dispersed therein. In this case, the bumps 14 and the external electrodes 17 may be connected electrically via the solid filling. More specifically, in this case, it is not required to bring the bumps 14 directly into contact with the external electrodes 17. For example, metal powder may be used for the solid filling.

The side wall 16 is made of, for example, insulating resin. In particular, by using photosensitive resin, the side wall 16 can be formed easily. The piezoelectric substrate 11, the insulating sheet 15, and the side wall 16 form a space 19, which allows the comb electrodes 12 to vibrate, on the periphery of the comb electrodes 12. Due to the space 19, propagation of a surface acoustic wave can be ensured. The space 19 preferably is an enclosed space. The space 19 may be formed into an enclosed space by using resin disposed so as to cover the periphery of the side wall 16. In FIGS. 1A to 1C, the side wall 16 has a frame shape. However, the side wall 16 may not surround the periphery of the comb electrodes 12. For example, the side wall 16 may have a column shape. In this case, the space on the periphery of the comb electrodes 12 is formed into an enclosed space by using resin disposed so as to cover the periphery of the side wall 16 (this also applies to the following embodiments). The height of the side wall 16 (i.e., the distance between the piezoelectric substrate 11 and the insulating sheet 15) is, for example, about 0.02 mm to 0.2 mm. In Embodiment 1, the insulating sheet 15 and the side wall 16 are separate members. However, they may be integrally molded by heating resin.

The external electrodes 17 function as terminals for mounting the SAW device 10 on another substrate. The wiring lines 18 are formed so as to connect the comb electrodes 12 to the electrode pads 13. The external electrodes 17 and the wiring lines 18 can be formed of a material generally used for an electrical circuit.

The SAW device 10 is an exemplary SAW device of the present invention. The SAW device of the present invention includes other various modifications as described in the following embodiments.

In the SAW device of Embodiment 1, the electrode pads 13, the bumps 14, and the external electrodes 17 can be disposed in the same straight line, so that the SAW device can be further miniaturized, compared with a conventional device. Furthermore, by using a resin material with low stiffness for the insulating sheet 35, warpage of the device, and residual stress of a connecting portion between the electrode pads 13 and the bumps 14, and a connecting portion between the bumps 14 and the external electrodes 17 can be reduced. As a result of reduction in warpage of the device, the mounting of the device to another wiring substrate becomes easy, which enhances reliability. Furthermore, as a result of reduction in residual stress at the connecting portions, the reliability of the apparatus after mounting is enhanced.

Embodiment 2

In Embodiment 2, an example of the method for producing a SAW device of the present invention will be described.

According to the production method of Embodiment 2, (a) a plurality of comb electrodes for exciting a surface acoustic wave and bumps connected electrically to the comb electrodes are formed on a principal plane of a piezoelectric substrate. Thereafter, (b) the principal plane of the piezoelectric substrate is opposed to an insulating sheet, and the piezoelectric substrate and the insulating film are brought closer together so that the bumps penetrate through the insulating sheet.

The production method of Embodiment 2 is an exemplary production method of the present invention. The production method of the present invention includes other various modifications as described in the following embodiments. According to the production method of the present invention, the members described in Embodiment 1, for example, a piezoelectric substrate, comb electrodes, electrode pads, bumps, an insulating sheet, a side wall, external electrodes, and wiring lines can be used.

Embodiment 3

Figure 3A:
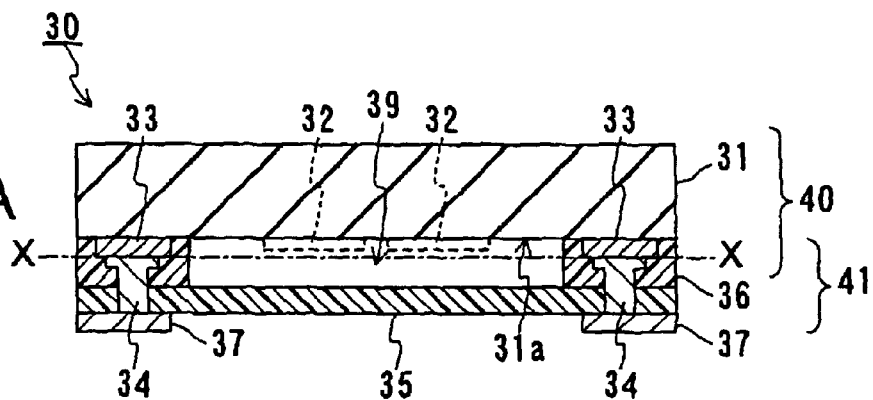
FIGS. 3A and 3B are cross-sectional views showing another exemplary SAW device of the present invention.
Figure 3B:
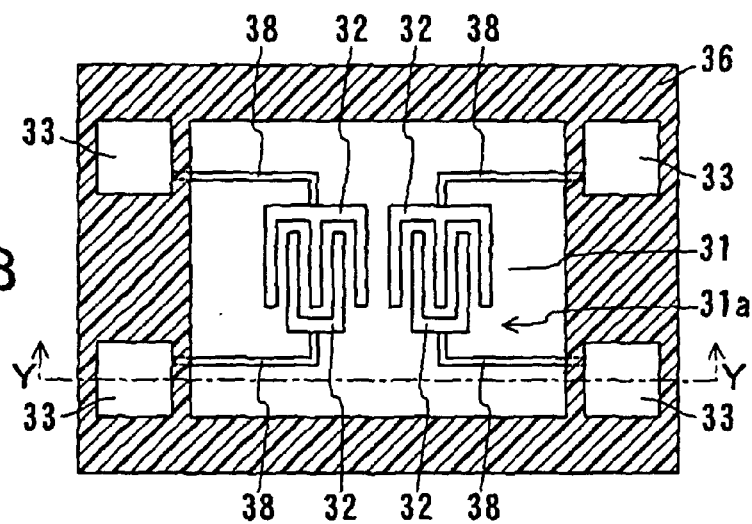

In Embodiment 3, an example of the SAW device of the present invention described in Embodiment 1 will be described. FIGS. 3A and 3B are cross-sectional views of a SAW device 30 of Embodiment 3. FIG. 3B is a cross-sectional view of a piezoelectric substrate 31 side, taken along a line X—X in FIG. 3A. FIG. 3A is a cross-sectional view taken along a line Y—Y in FIG. 3B.

The SAW device 30 includes a piezoelectric substrate 31, a plurality of comb electrodes 32 disposed on a principal plane 31a of the piezoelectric substrate 31, a plurality of electrode pads 33 disposed on the principal plane 31a, a plurality of bumps 34 disposed on the principal plane 31a (specifically, electrode pads 33), an insulating sheet 35 disposed so as to be opposed to the principal plane 31a, a side wall 36 disposed between the piezoelectric substrate 31 and the insulating sheet 35, external electrodes 37 formed on the insulating sheet 35, and wiring lines 38 electrically connecting the comb electrodes 32 to the electrode pads 33. The SAW device 30 has a thickness of 0.6 mm, and a plane size of 1.5 mm x 1.0 mm.

The piezoelectric substrate 31 is a 36° y-cut lithium tantalate substrate. The piezoelectric substrate 31 has a thickness of 0.3 mm, and the size of the principal plane 31a is 1.5 mm×1.0 mm. In the SAW device 30, a thinner piezoelectric substrate 31 (thickness: 0.15 mm) also can be used.

The SAW device 30 includes four bumps 34. The bumps 34 are made of gold. The bumps 34 penetrate through the side wall 36 and the insulating sheet 35 to be connected electrically to the external electrodes 37. The piezoelectric substrate 31, the comb electrodes 32, the electrode pads 33, and the bumps 34 constitute a surface acoustic wave element 40 (hereinafter, which may be referred to as an "SAW element").

The insulating sheet 35 is made of epoxy resin. The thickness of the insulating sheet is 0.025 mm, and the plane size thereof is the same as that of the piezoelectric substrate 31.

The side wall 36 is made of epoxy resin. The thickness of the side wall 36 is 0.05 mm, and the size thereof is the same as that of the piezoelectric substrate 11. The piezoelectric substrate 31, the insulating sheet 35, and the side wall 36 form an enclosed space 39, which allows the comb electrodes 32 to vibrate, on the periphery of the comb electrodes 32.

The external electrodes 37 are made of a nickel layer and a gold layer stacked from the insulating sheet 35. The insulating sheet 35, the side wall 36, and the external electrodes 37 constitute a carrier 41.

Embodiment 4

In Embodiment 4, an example will be described in which the SAW device 30 is produced by the production method described in Embodiment 2. FIGS. 4A to 4E are cross-sectional views showing the processes of the production method of Embodiment 4. In FIGS. 4A to 4E, only one SAW device 30 is shown; however, generally, a plurality of devices are formed simultaneously using a wafer substrate.

First, as shown in FIG. 4A, the comb electrodes 32, the electrode pads 33, and the wiring lines 38 (not shown) are formed on the principal plane 31a of the piezoelectric substrate 31. These members can be obtained by forming a metal film by sputtering, followed by patterning using photolithography. Furthermore, the bumps 34 are formed on the electrode pads 33. The bumps 34 can be formed, for example, by connecting gold wires to the electrode pads 33 by ball bonding, and cutting the gold wires. Thus, the SAW element 40 is formed.

Prior to, in parallel with, or after the process of FIG. 4A, a carrier 41a is formed as shown in FIG. 4B. FIGS. 5A to 5D are cross-sectional views showing the processes of the method for producing the carrier 41a. First, as shown in FIG. 5A, a resin sheet 52 is formed on a release sheet 51. The resin sheet 52 is made of resin in a semi-cured state. Thereafter, as shown in FIG. 5B, central portions of the release sheet 51 and the resin sheet 52 are punched by mechanical processing such as punching, whereby a side wall 36a is formed. The side wall 36a becomes the side wall 36 by curing the resin.

On the other hand, as shown in FIG. 5C, an insulating sheet 35a is formed on a release sheet 53, and external electrodes 37 are formed on the insulating sheet 35a. The insulating sheet 35a is made of resin in a semicured state, and becomes the insulating sheet 35 by curing the resin. The external electrodes 37 can be formed, for example, by plating, vacuum deposition, or sputtering. At this time, the external electrodes 37 can be patterned using a metal mask by photolithography and etching. Furthermore, the external electrodes 37 also can be formed by attaching a metal sheet to the insulating sheet 35a with an adhesive, and removing a part of the metal sheet by etching. The metal sheet preferably is made of metal such as copper that can be drawn easily. It also may be possible that the metal sheet is coated with resin to form the insulating sheet 35a. According to the method using a metal sheet, the external electrodes 37 that are thick and highly reliable can be formed easily.

Thereafter, as shown in FIG. 5D, the insulating sheet 35a with the release sheet 53 peeled off and the side wall 36a are attached to each other, and the release sheet 51 is peeled off, whereby the carrier 41a is formed. The side wall 36a is formed at a position corresponding to the bumps 34. The side wall 36a and the insulating sheet 35a only need to be attached to each other to such a degree that they do not come off from each other. More specifically, the side wall 36a and the insulating sheet 35a are heated to a temperature at which resin is not cured while they are pressed, whereby they can be attached to each other.

Next, as shown in FIG. 4C, the principal plane 31a of the piezoelectric substrate 31 is opposed to the insulating sheet 35a (carrier 41a). Then, as shown in FIG. 4D, the piezoelectric substrate 31 and the insulating sheet 35a are brought closer together under pressure so that the bumps 34 penetrate through the side wall 36a and the insulating sheet 35a to be connected to the external electrodes 37. Hereinafter, the process of connecting the bumps 34 to the external electrodes 37 may be referred to as a mounting process. At this time, the piezoelectric substrate 31 and the insulating sheet 35a are brought closer together in such a manner that the side wall 36a comes into contact with the piezoelectric substrate 31, and the piezoelectric substrate 31, the side wall 36a, and the insulating sheet 35a form an enclosed space. In the mounting process, the carrier 41a (insulating sheet 35a and side wall 36a) is heated at a temperature lower than a resin curing temperature to soften resin, thereby allowing the bumps 34 to penetrate through the side wall 36a and the insulating sheet 35a under a small pressure. In particular, it is preferable that the carrier 41a (insulating sheet 35a and side wall 36a) is heated to a temperature equal to or higher than a glass transition temperature of resin. Furthermore, assuming that the resin curing temperature that is a material for the insulating sheet 35a and the side wall 36a is T1 (° C.), it is preferable that the carrier 41a is heated at a temperature equal to or lower than (T1−20)° C. This prevents the resin from being cured in the course of the mounting process.

Next, as shown in FIG. 4E, the carrier 41a is heated at a temperature of 160° C. to cure the side wall 36a and the insulating sheet 35a, whereby the carrier 41 having the side wall 36 and the insulating sheet 35 are formed. In this manner, the SAW device 30 can be formed.

Figure 6A:
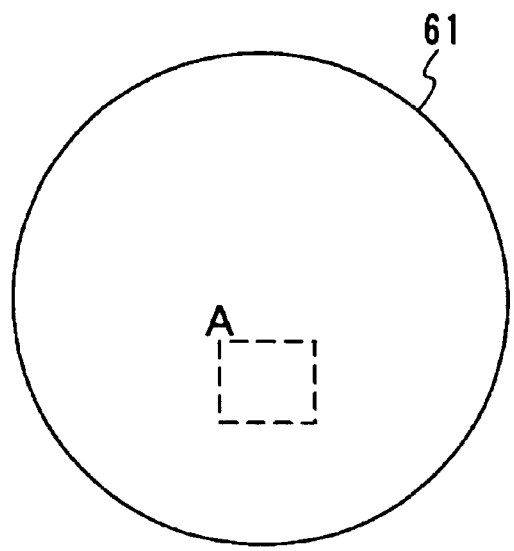
FIG. 6A is a view showing an exemplary process of producing a SAW element in the production method shown in FIGS. 4A to 4E.
Figure 6B:
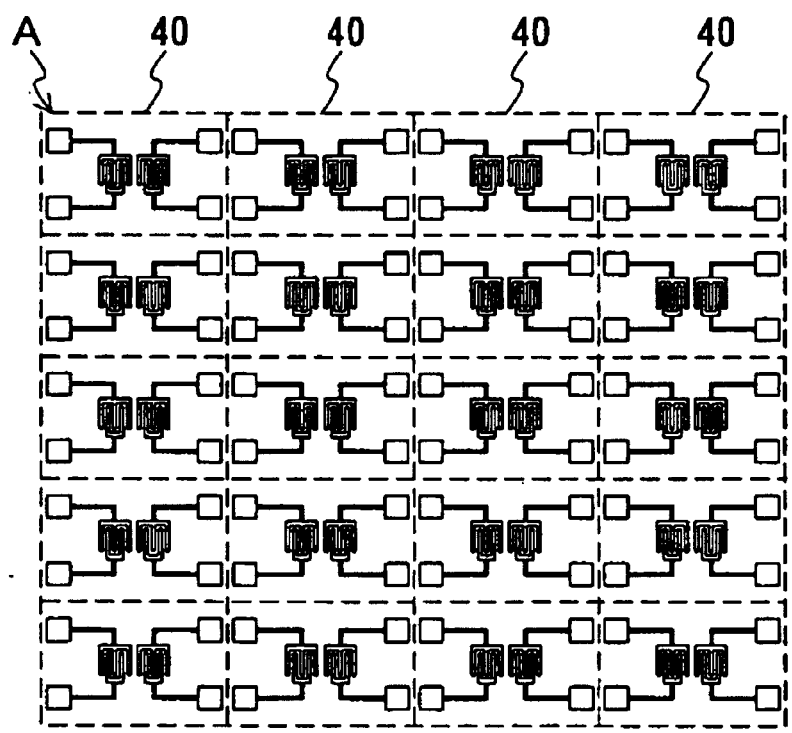
FIG. 6B is an enlarged view of an example of a region A in FIG. 6A.
Figure 7:
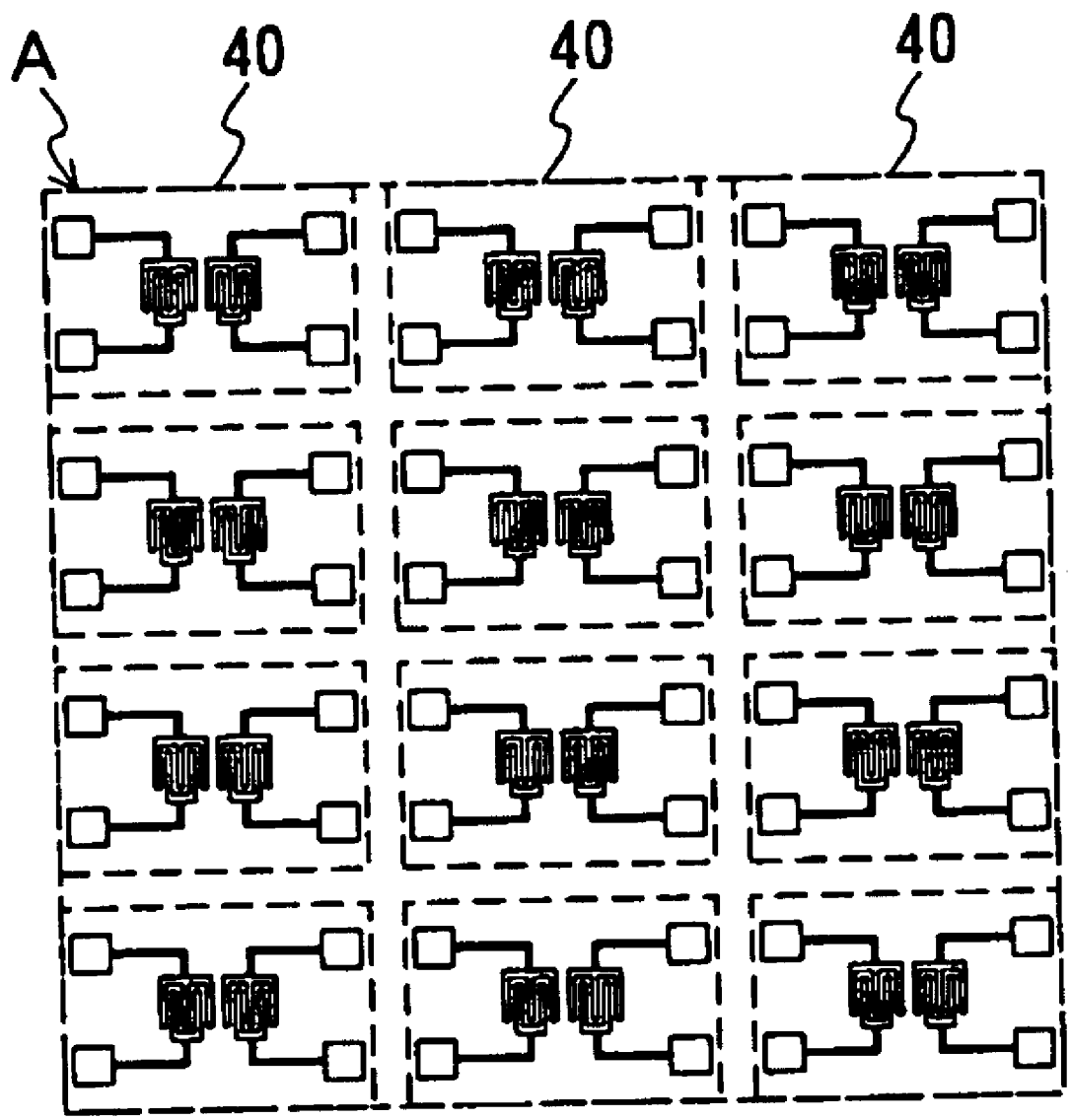
FIG. 7 is an enlarged view of another example of the region A in FIG. 6A.

According to the production method of Embodiment 4, a plurality of SAW elements 40 can be formed on a wafer as shown in FIGS. 6A and 6B or 7 (this also applies to the following embodiments). FIG. 6A is a plan view of a piezoelectric substrate 61 in a wafer shape, and FIG. 6B is an enlarged view showing an example of a region A in FIG. 6A. FIG. 7 is an enlarged view showing another example of the region A in FIG. 6A. In general, a wafer having a diameter of 3 to 4 inches is used. Furthermore, it also may be possible to use a piezoelectric substrate obtained by cutting a wafer to a particular size.

Figure 8A:
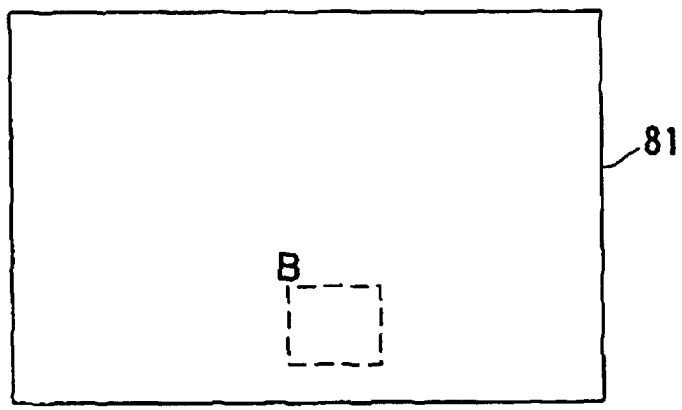
FIG. 8A shows an exemplary process of producing a carrier in the production method shown in FIGS. 4A to 4E.
Figure 8B:
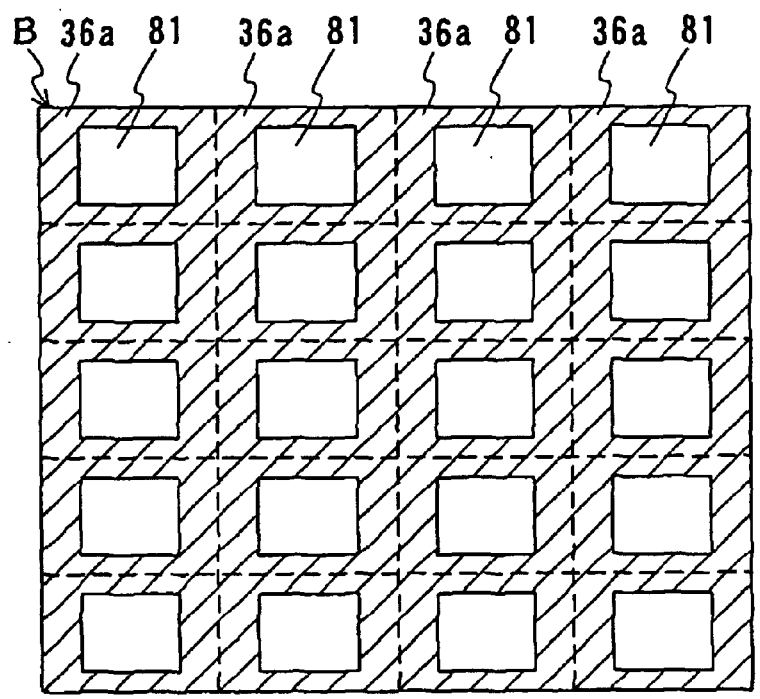
FIG. 8B is an enlarged view of an example of a region B in FIG. 8A.
Figure 9:
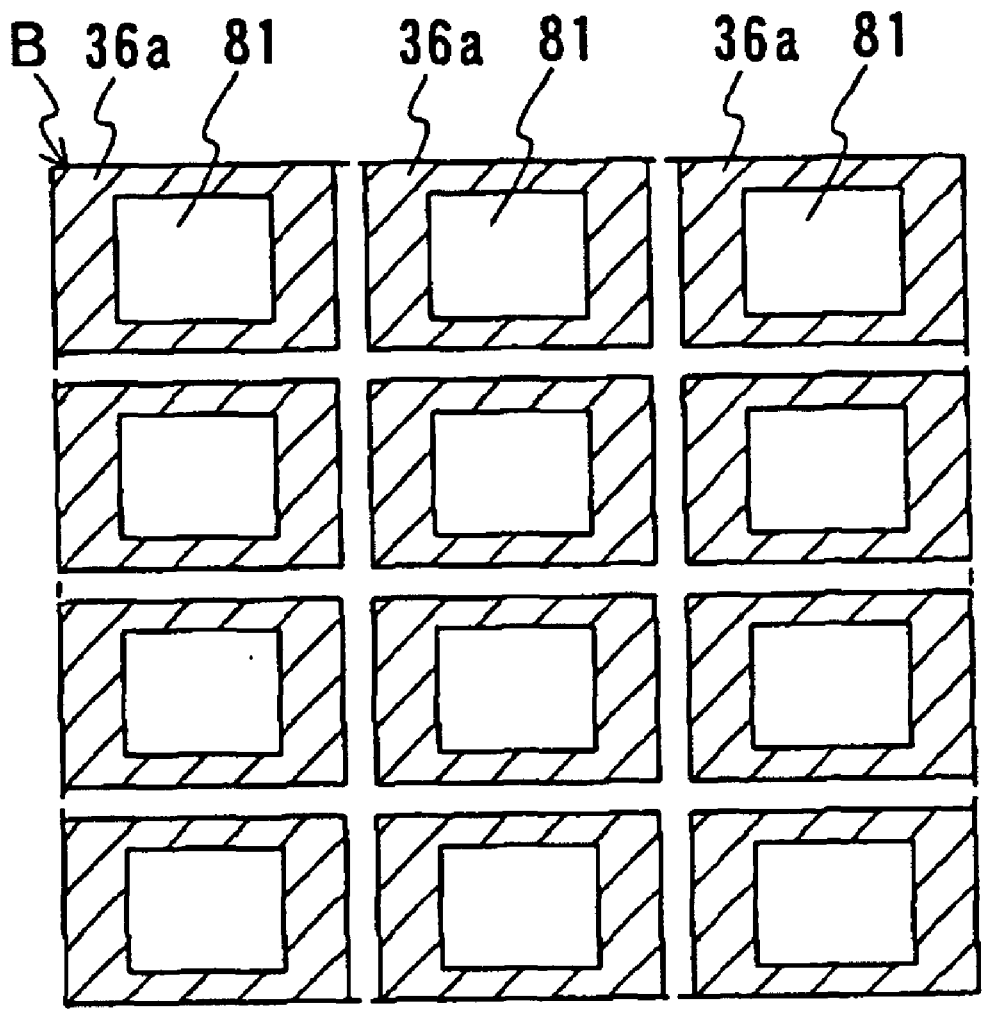
FIG. 9 is an enlarged view of another example of the region B in FIG. 8A.

Similarly, as shown in FIGS. 8A and 8B or 9, a plurality of carriers 41 may be formed simultaneously (this also applies to the following embodiments). FIG. 8A shows the case where a plurality of side walls 36a (represented by shaded areas in FIGS. 8B and 9) are formed on an insulating sheet 81 composed of a plurality of insulating sheets 35a. FIG. 8B is an enlarged view of an example of a region B in FIG. 8A. FIG. 9 is an enlarged view of another example of the region B in FIG. 8A.

A plurality of SAW elements 40 formed by using the piezoelectric substrate 61 in a wafer shape may be mounted on the insulating sheet 81 after being divided into each element. Alternatively, a plurality of SAW elements 40 formed by using the piezoelectric substrate 61 may be mounted on the insulating sheet 81 as they are. By mounting a plurality of SAW elements as they are, a SAW device can be produced with good productivity at low cost.

According to the production method of Embodiment 4, it also may be possible that a plurality of SAW elements are produced by using a thick piezoelectric substrate in a wafer shape and mounted on a carrier as shown in FIG. 8B or 9 as they are, and the piezoelectric substrate is ground to be thin (this also applies to the following embodiments). In grinding, it is preferable that the border between the SAW element and the carrier at the end of the wafer is sealed with removable resin. This prevents an abrasive from entering between the SAW element and the carrier. According to this production method, a thick piezoelectric substrate can be used, so that a SAW device can be produced with good yield.

According to the production method of Embodiment 4, the insulating sheet 35 is made of a material with low stiffness. Therefore, the mounting process can be conducted easily. Furthermore, it is not required to align the height of the bumps 34, so that a SAW device can be produced easily. Still furthermore, soldering is not required for fixing the SAW element 40 to the carrier 41, so that the element is not heated to a high temperature, which prevents pyroelectric damage.

In the mounting process in FIG. 4D, it also may be possible that the piezoelectric substrate 31 and the insulating sheet 35*a* are brought closer together while an ultrasonic wave is applied to either the SAW element 40 or the carrier 41*a* (insulating sheet 35*a* and side wall 36*a*), or both of them. An ultrasonic wave only needs to be applied for a predetermined period of time during the mounting process. For example, an ultrasonic wave starts being supplied 100 msec. after the bumps 34 start penetrating through the side wall 36*a*, and is applied until the mounting is completed. By applying an ultrasonic wave, the following effects can be obtained: (1) a pressure during the mounting process can be decreased, (2) a heating temperature during the mounting process can be lowered, and (3) the bumps 34 and the external electrodes 37 can be connected to each other satisfactorily. Hereinafter, these effects will be described in detail.

When a pressure during the mounting process is too high, the piezoelectric substrate 31 may be cracked and the side wall 36*a* may be crushed. Therefore, a pressure during the mounting process preferably is low. In the production method of Embodiment 4, assuming that the number of the bumps 34 is n (this also applies to the following description), by applying an ultrasonic wave of 0.1 n (W), a pressure required for allowing the bumps 34 to penetrate through the side wall 36*a* can be decreased to 70% or less. Furthermore, by applying an ultrasonic wave of 0.2 n (W), a required pressure can be decreased to 50% or less.

When a heating temperature during the mounting process is too high, the resin constituting the insulating sheet 35*a* and the side wall 36*a* may become too soft. Furthermore, when a heating temperature is too high, the characteristics of the SAW element 40 may be degraded. Thus, a heating temperature during the mounting process preferably is low. In the production method of Embodiment 4, by applying an ultrasonic wave of 0.1 n (W), a heating temperature (° C.) required for allowing the bumps 34 to penetrate through the side wall 36*a* can be decreased to 80% or less. Furthermore, by applying an ultrasonic wave of 0.2 n (W), a required heating temperature (° C.) can be decreased to 60% or less.

When an ultrasonic wave is applied during the mounting process, the resin can be prevented from remaining at the interfaces between the bumps 34 and the external electrodes 37. Therefore, the reliability of the connecting portions between the bumps 34 and the external electrodes 37 is enhanced. As a result, a SAW device with high reliability with respect to changes in environment and vibrations can be obtained.

Furthermore, in the case where an ultrasonic wave is applied during the mounting process, it is preferable that the bumps 34 and the external electrodes 37 are made of gold, and the mounting process is conducted so that the bumps 34 and the external electrodes 37 are connected to each other by a solid-phase diffusion reaction of gold. More specifically, the mounting process may be conducted while applying an ultrasonic wave in a range of 0.2 n (W) to 1 n (W) at a heating temperature of 120° C. to 200° C. Apart of the ultrasonic wave applied at this time is absorbed by the insulating sheet 35*a* and the side wall 36*a*, so that a SAW device is not so damaged even if an ultrasonic wave is applied at an output higher than that of an ultrasonic wave applied for general mounting. Therefore, an ultrasonic wave with a high output can be applied, and a heating temperature can be decreased to 120° C. By connecting the bumps 34 to the external electrodes 37 by using a solid-phase diffusion reaction of gold, the reliability of connection between the bumps 34 and the external electrodes 37 can be enhanced. Furthermore, according to this connection method, the characteristics of the SAW element 40 can be prevented from being decreased by heating.

Embodiment 5

Figure 10A:
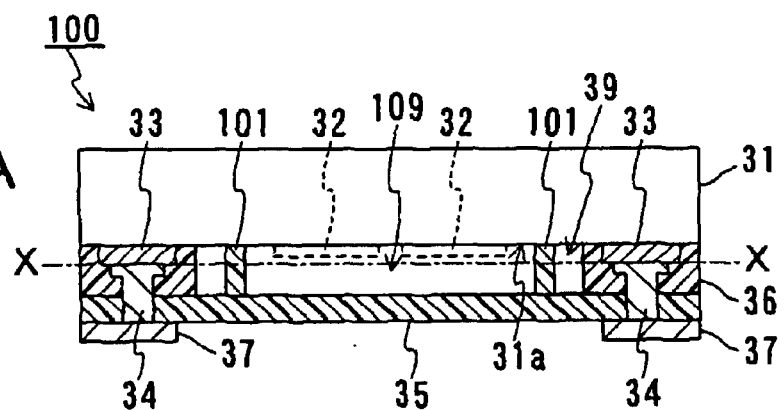
FIGS. 10A and 10B are cross-sectional views showing still another exemplary SAW device of the present invention.
Figure 10B:
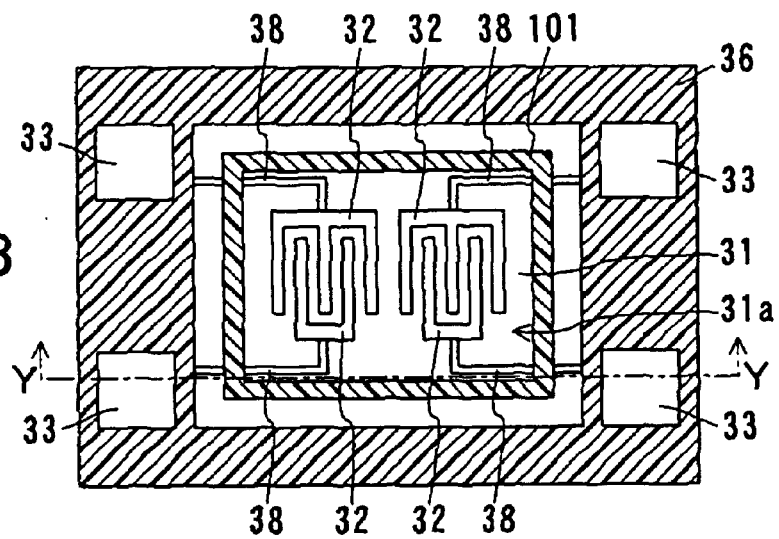

In Embodiment 5, another example of the SAW device of the present invention will be described. FIG. 10A is a cross-sectional view of a SAW device 100 of Embodiment 5. Furthermore, FIG. 10B is a cross-sectional view of the piezoelectric substrate 31 side, taken along a line X—X in FIG. 10A. FIG. 10A is a cross-sectional view taken along a line Y—Y in Figure 10B. In FIG. 10B, the wiring lines 38 are not shown.

The SAW device 100 further includes a partition wall 101 disposed between the comb electrodes 32 and the side wall 36, in addition to the SAW device 30 in Embodiment 3. The SAW device 100 is the same as the SAW device 30 except for the partition wall 101.

The partition wall 101 is made of resin. For example, photosensitive acrylic resin, photosensitive epoxy resin, or photosensitive polyimide resin can be used. The piezoelectric substrate 31, the insulating sheet 35, and the partition wall 101 form a second enclosed space 109. More specifically, the periphery of the comb electrodes 32 is double-sealed with the enclosed spaces 39 and 109. Furthermore, the partition wall 101 prevents the insulating sheet 35 with low stiffness from being deformed to come into contact with the comb electrodes 32. Thus, because of the partition wall 101, the SAW device 100 has particularly high characteristics and reliability.

Figure 11A:
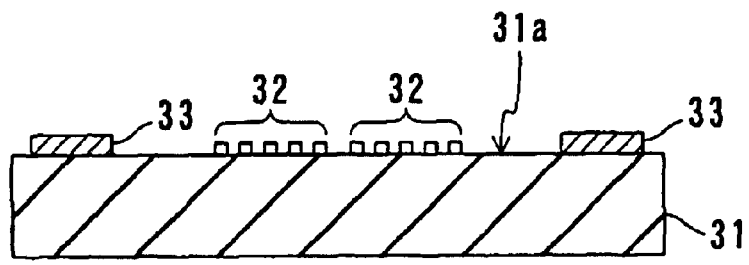
FIGS. 11A to 11D are cross-sectional views showing another exemplary method for producing a SAW device of the present invention.

The SAW device 100 can be produced by adding the process of forming the partition wall 101 to the production method described in Embodiment 4. An example of the production method will be described below. First, as shown in FIG. 11A, the comb electrodes 32 and the electrode pads 33 are formed on the principal plane 31*a* of the piezoelectric substrate 31.

Figure 11B:
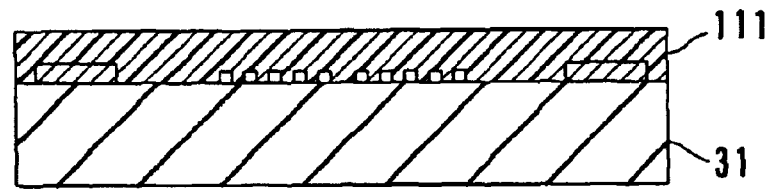

Then, as shown in FIG. 11B, a photosensitive acrylic resin sheet 11 is laminated onto the principal plane 31*a*. The thickness of the acrylic resin sheet 111 is set to be larger than the height of the side wall 36.

Figure 11C:
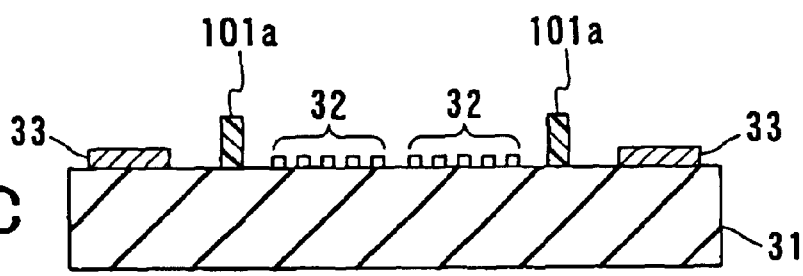

Then, as shown in FIG. 11C, the acrylic resin sheet 111 is exposed to light and developed, whereby the acrylic resin sheet 111 is patterned to form a side wall 101*a*. The side wall 101*a* becomes the partition wall 101 by curing the resin.

Figure 11D:
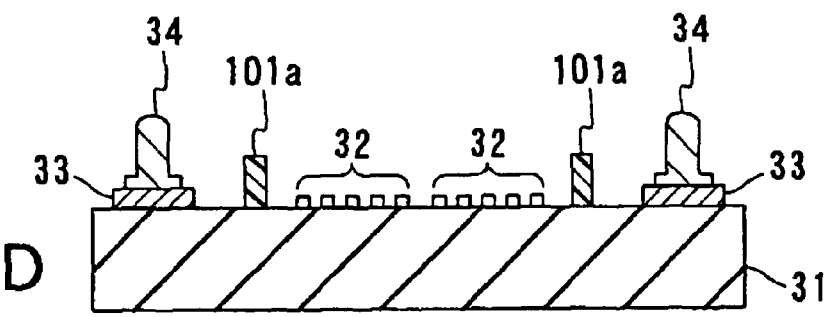

Then, as shown in FIG. 11D, the bumps 34 are formed on the electrode pads 33. Thereafter, the SAW device 100 can be produced by the same method as that described in Embodiment 4.

According to the above-mentioned production method, the partition wall 101 can prevent the insulating sheet 35 from being deformed to come into contact with the comb electrodes 32. Furthermore, the partition wall 101 can prevent the side wall 36 from being deformed by a high pressure so as to come into contact with the comb electrodes 32.

Embodiment 6

Figure 12:
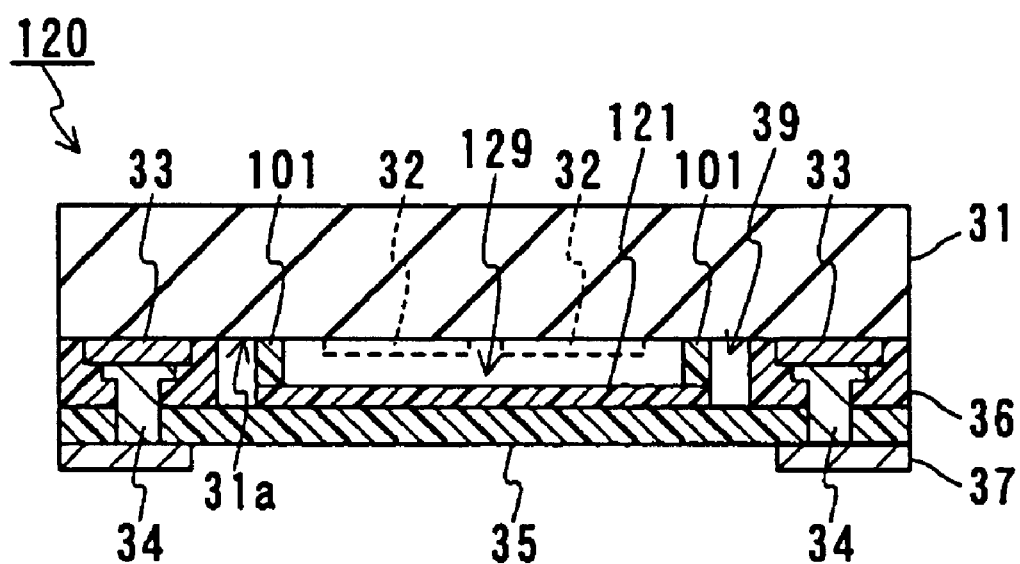
FIG. 12 is a cross-sectional view showing still another exemplary SAW device of the present invention.

In Embodiment 6, still another example of the SAW device of the present invention will be described. FIG. 12 is a cross-sectional view of a SAW device 120 of Embodiment 6. The SAW device 120 is the same as the SAW device 100 except for a roof member 121. In Embodiment 6, repeated descriptions of the same members as those of the SAW device 100 will be omitted.

The roof member 121 is disposed between the piezoelectric substrate 31 and the insulating sheet 35. The roof member 121 is made of, for example, acrylic resin. The roof member 121 functions as a cover of the partition wall 101. The piezoelectric substrate 31, the partition wall 101, and the roof member 121 form a second enclosed space 129. The roof member 121 is in contact with the insulating sheet 35.

In the SAW device 120, the periphery of the comb electrodes 32 is double-sealed with the enclosed spaces 39 and 129. Therefore, in the SAW device 120, the air-tightness of the periphery of the comb electrodes 32 can be enhanced. Furthermore, the insulating sheet 35 can be prevented from coming into contact with the comb electrodes 32.

The SAW device 120 can be produced by disposing the roof member 121 on the partition wall 101a after the process of FIG. 11C. The roof member 121 is formed, for example, by patterning a photosensitive resin sheet by light-exposure and development. At this time, the partition wall 101a and the roof member 121 are formed so that the sum of the height of the partition wall 101a and the thickness of the roof member 121 becomes larger than the height of the side wall 36. According to the production method of Embodiment 6, the effects described in Embodiment 5 can be obtained. Furthermore, according to this production method, the characteristics of the SAW element 40 are prevented from being degraded by an organic solvent generated when resin is cured.

Figure 13:
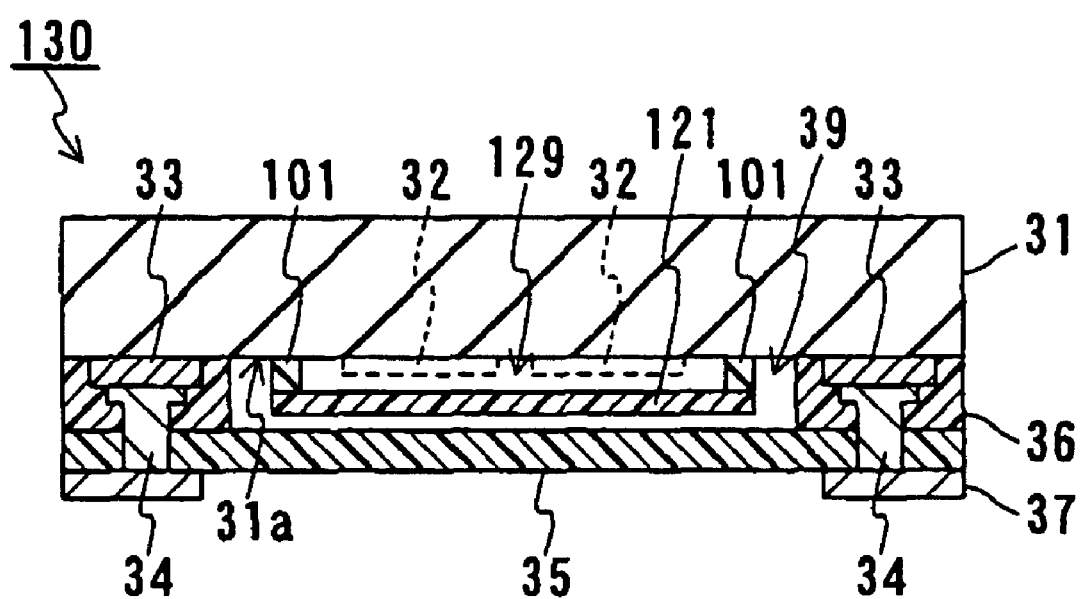
FIG. 13 is a cross-sectional view showing still another exemplary SAW device of the present invention.

The roof member 121 may be disposed at a position away from the insulating sheet 35. FIG. 13 is a cross-sectional view of such a SAW device 130. In the SAW device 130, the insulating sheet 35 and the roof member 121 are not in contact with each other. Therefore, a chemical reaction therebetween can be prevented. This enables a SAW device with high reliability to be obtained. Furthermore, the insulating sheet 35 and the roof member 121 can be formed of different materials.

Embodiment 7

Figure 14:
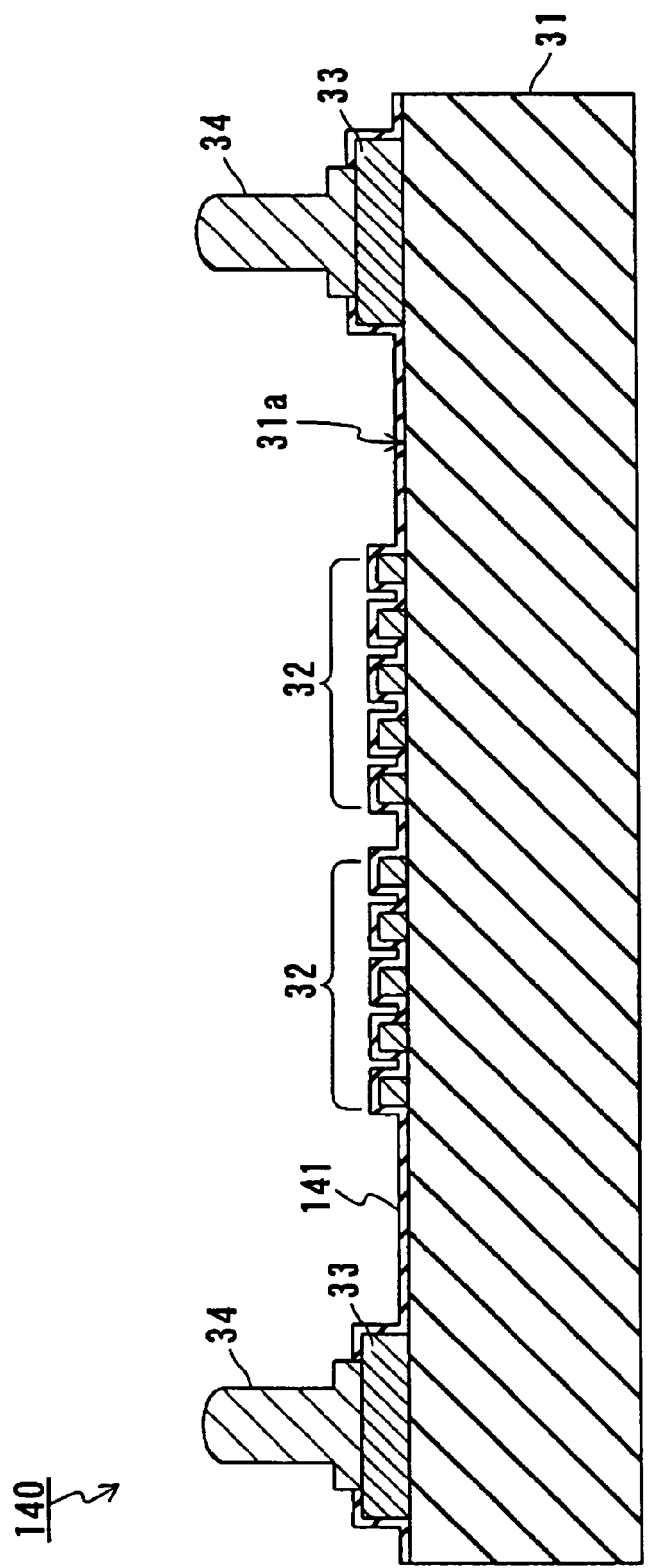
FIG. 14 is a cross-sectional view showing a part of still another exemplary SAW device of the present invention.

In Embodiment 7, still another example of the SAW device of the present invention will be described. FIG. 14 is an enlarged view of a portion of a SAW element in a SAW device 140 of Embodiment 7. The SAW device 140 includes the carrier 41 in the same way as in the SAW device 30.

The SAW device 140 is different from the SAW device 30 of Embodiment 3 only in that a film 141 is formed on the principal plane 31a of the piezoelectric substrate 31. In Embodiment 7, repeated descriptions of the same members as those of the SAW device 30 will be omitted.

The SAW device 140 has the film 141 formed so as to cover a plurality of comb electrodes 32 on the principal plane 31a. The film 141 is made of a material for enhancing the adhesion between the piezoelectric substrate 31 and the side wall 36. More specifically, a silicon compound can be used. For example, silicon oxide ($Si_2$, SiO), and silicon nitride can be used.

In the SAW device 140, the film 141 enhances the adhesion between the piezoelectric substrate 31 and the side wall 36. This reduces the ability of moisture to enter the enclosed space 39 from the interface between the piezoelectric substrate 31 and the side wall 36, resulting in enhancement of the moisture resistance of the device. Furthermore, the enhancement of adhesion improves the reliability of the device.

In order to confirm the above-mentioned effects, the SAW devices 30 and 140 were produced, and a leakage test using inactive gas was conducted. As a result, the leakage amount of gas from the enclosed space in the SAW device 140 was ¹⁄₁₀ or less of that in the SAW device 30.

Furthermore, the SAW devices 30 and 140 were subjected to a reliability test in which these devices were left to stand in an atmosphere of a relative humidity of 85% at 85° C. As a result, the ratio of defective products of the SAW device 120 was much lower than that of the SAW device 30.

Furthermore, the SAW devices 30 and 140 were subjected to a thermal shock test. As a result, the ratio of defective products of the SAW device 140 was much lower than that of the SAW device 30.

Embodiment 8

In Embodiment 8, still another example of the SAW device of the present invention will be described. In the SAW device of Embodiment 8, a protective member is formed in the SAW device 30.

Figure 15:
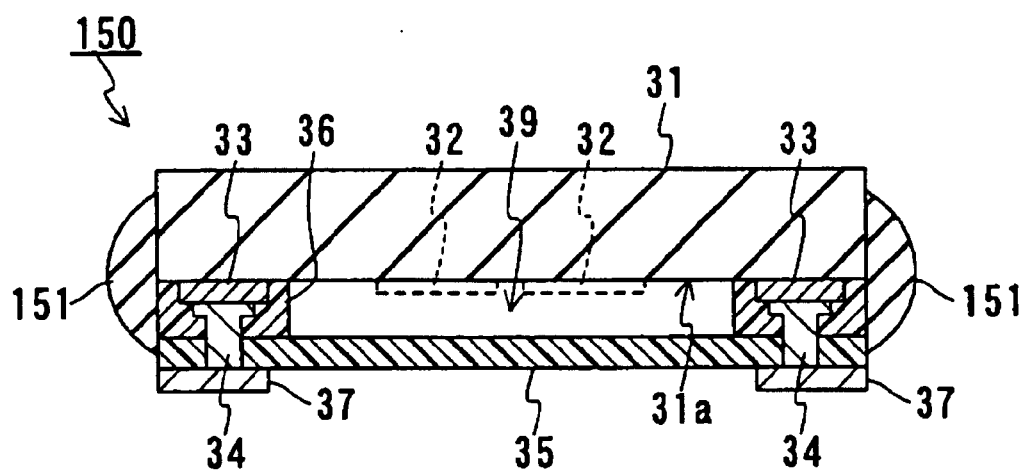
FIG. 15 is a cross-sectional view showing still another exemplary SAW device of the present invention.

FIG. 15 is a cross-sectional view of a SAW device 150 of Embodiment 8. The SAW device 150 is different from the SAW device 30 only in that a moisture-resistant protective member 151 is formed so as to cover the side face (side wall 36).

The protective member 151 is made of a material with high moisture resistance. For example, a silicon compound, epoxy resin, silicone resin, fluorine resin, or acrylic resin can be used. More specifically, water-repellent fluorine resin, $SiO_2$, or SiN can be used. It is preferable that a resin to be a material for the protective member 151 varies in mass by 2% or less when left to stand in a saturated steam atmosphere at 121° C. and 2 atmospheric pressure for 20 hours.

The protective member 151 not only prevents moisture from entering the enclosed space 39 but also enhances shock resistance of the device. Therefore, the SAW device 150 has higher moisture resistance and shock resistance than the SAW device 30.

Figure 16:
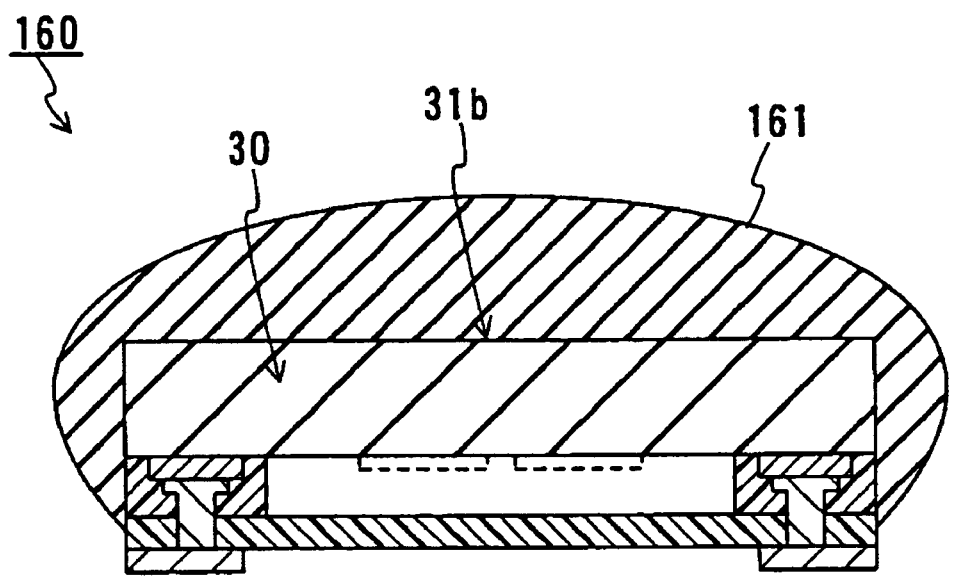
FIG. 16 is a cross-sectional view showing still another exemplary SAW device of the present invention.

The protective member 151 may be formed so as to cover the other principal plane 31b (opposite to the principal plane 31a) of the piezoelectric substrate 31 and the side face (side wall 36) of the device. FIG. 16 is a cross-sectional view showing an example of such a SAW device 160.

The SAW device 160 is different from the SAW device 30 only in that the protective member 161 is provided. The protective member 161 is formed so as to cover the principal plane 31b of the piezoelectric substrate 31 and the side face. The protective member 161 can be made of the same material as that of the protective member 151. The protective member 161 is formed so as to cover the principal plane 31b, so that more excellent shock resistance can be obtained in addition to that obtained by the protective member 151. The protective member 161 is formed by integrating a first protective member formed so as to cover the side wall 36 with a second protective member formed so as to cover the principal plane 31b.

The SAW devices 150 and 160 were produced and evaluated for shock resistance. More specifically, a weight (10 g) was attached to each device, and each device was dropped onto a concrete surface. As a result, the SAW device 160 was more excellent in shock resistance than the SAW device 150.

The protective member may be covered with a protective film (this also applies to the following embodiments). The protective film is made of, for example, a silicon compound, a water-repellent resin material, or a metal material. Examples of the silicon compound include silicon dioxide and silicon nitride. Examples of the water-repellent resin material include fluorine resin and silicone resin.

Embodiment 9

Figure 17:
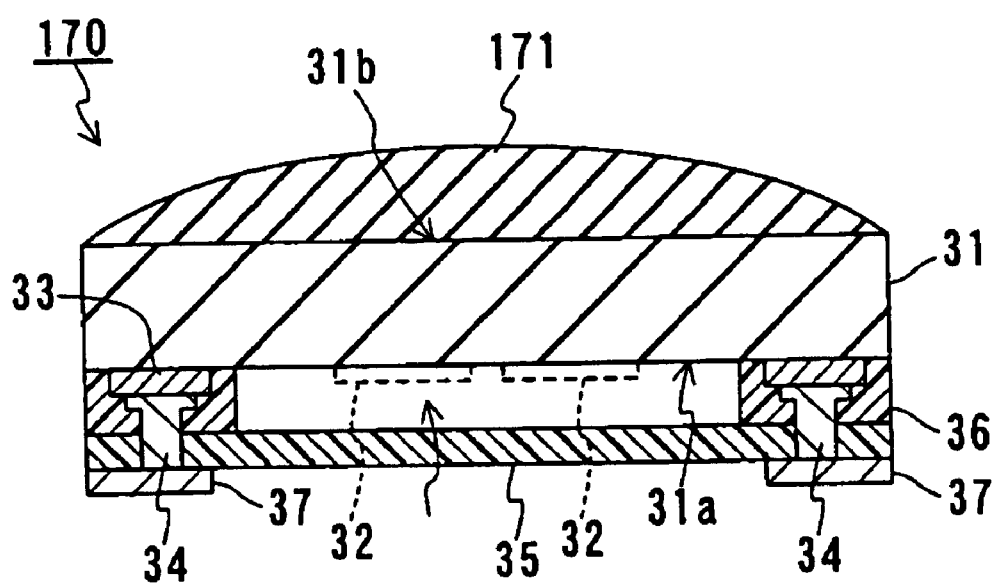
FIG. 17 is a cross-sectional view showing still another exemplary SAW device of the present invention.

In Embodiment 9, still another example of the SAW device of the present invention will be described. FIG. 17 is a cross-sectional view of a SAW device 170 of Embodiment 9. The SAW device 170 includes a protective member 171 formed on the principal plane 31b (opposite to the principal plane 31a) of the piezoelectric substrate 31.

The protective member 171 is formed so as to enhance the shock resistance of the device. The protective member 171 is made of a material absorbing shock such as resin. For example, epoxy resin, silicone resin, or acrylic resin can be used. Among them, silicone resin with low stiffness is more preferable in view of contraction stress during curing.

The SAW devices 30 and 170 were formed by using the piezoelectric substrate 31 with a thickness of 0.15 mm, and evaluated for shock resistance. More specifically, a weight (100 g) was attached to the SAW devices 30 and 170, respectively, and dropped onto a concrete surface, whereby shock resistance was evaluated. As a result, in the SAW device 170, shock resistance was further enhanced, compared with the SAW device 30.

The protective member 171 may be formed so as to cover the principal plane 31b and the side face as in the SAW device 160. Because of this, the moisture resistance and shock resistance of the SAW device are enhanced.

Embodiment 10

In Embodiment 10, another example of the SAW device and the method for producing the same of the present invention will be described.

Figure 18A:
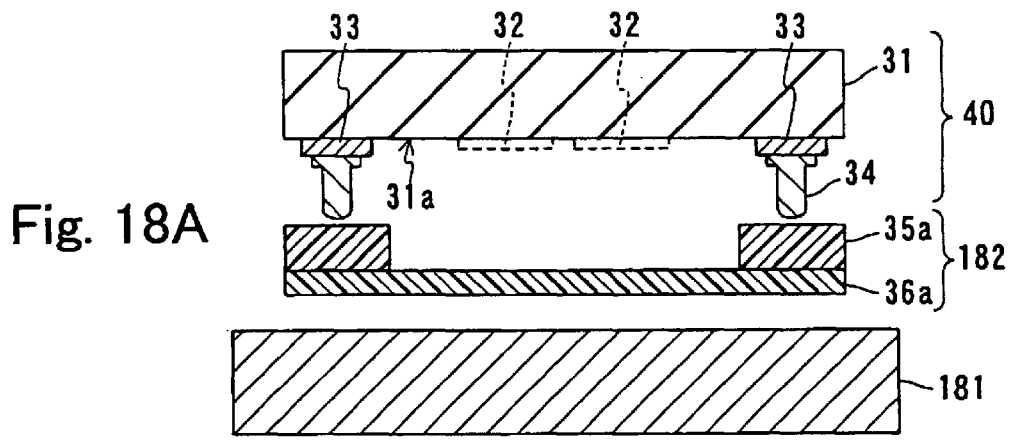
FIGS. 18A to 18C are cross-sectional views showing still another exemplary method for producing a SAW device of the present invention.
Figure 18B:
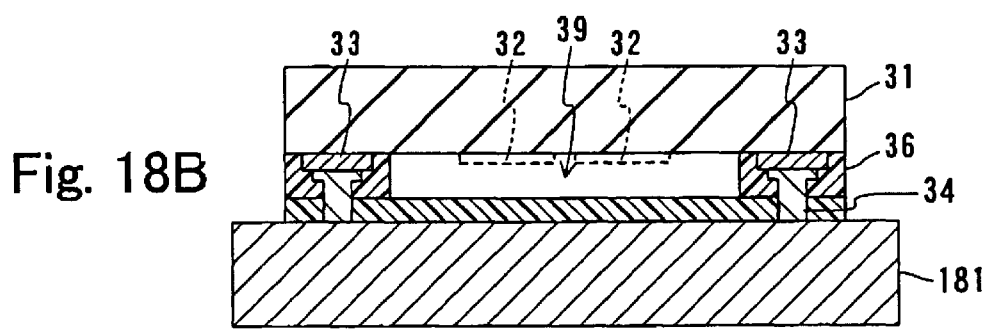
Figure 18C:
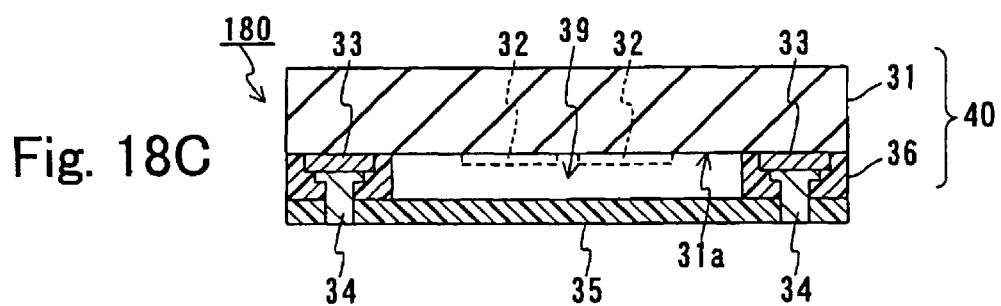

FIGS. 18A to 18C are cross-sectional views showing the processes of the production method of Embodiment 10. As shown in FIG. 18A, a carrier 182 and a SAW element 40 are opposed to each other above a base 181. As the base 181, for example, a base made of stainless steel coated with Teflon can be used. The carrier 182 can be formed by the same method as that shown in FIGS. 5A to 5D, except that the external electrodes 37 are not formed. The SAW element 40 can be formed by the same method as that described in FIG. 4A.

Next, as shown in FIG. 18B, the bumps 34 are allowed to penetrate through the carrier 182, and the bumps 34 are pressed against the base 181. The ends of the bumps 34 penetrating through the carrier 182 can be used as electrode terminal portions.

In the process of FIG. 18B, it is preferable that a film (e.g., Teflon coating) for preventing adhesion is provided on the surface of the base 181. Because of this, the bumps 34 can be prevented from adhering to the base 181. As a result, the SAW device 180 as shown in FIG. 18C is obtained.

According to the production method of Embodiment 10, the process of forming the external electrodes 37 can be omitted, so that the SAW device of the present invention can be produced at low cost. Furthermore, in the case where the external electrodes 37 are formed, it is required that the insulating sheet 35 is made of a material that can endure the process of forming the external electrodes 37 such as plating and vapor-phase film formation. In contrast, according to the production method of Embodiment 10, there is no such a constraint. Therefore, a choice of options of a material for the insulating sheet 35 is widened.

Figure 19A:
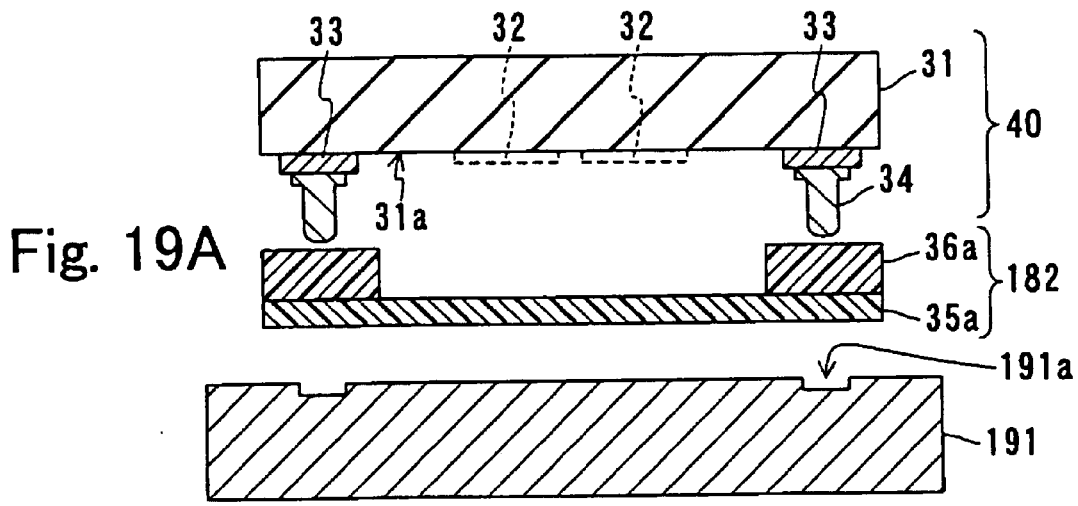
FIGS. 19A to 19C are cross-sectional views showing still another exemplary method for producing a SAW device of the present invention.
Figure 19B:
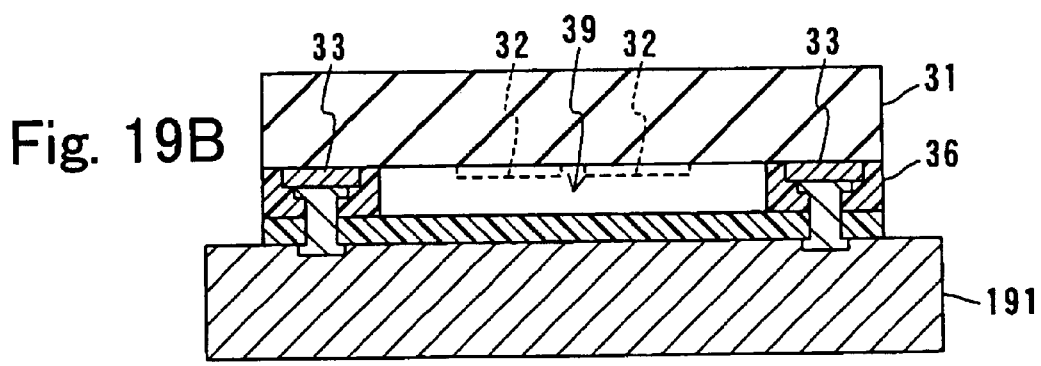
Figure 19C:
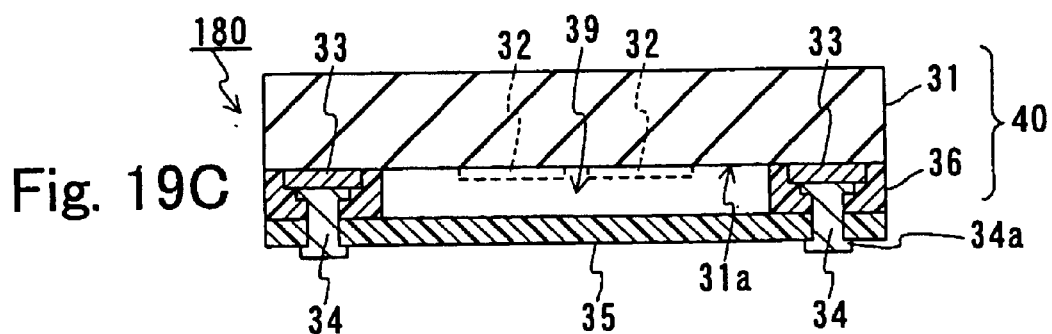

A base provided with concave portions at positions where electrode terminal portions will be formed may be used in place of the base 181. FIGS. 19A to 19C are cross-sectional views showing the processes of the production method using such a base 191.

In the processes of FIGS. 19A to 19C, a base 191 is used on which concave portions 19 1a are formed at positions where electrode terminal portions will be formed. As a result, the ends of the bumps 34 penetrating through the carrier 182 are formed in the shape of the concave portions 19 1a to become electrode terminal portions 34a. Thus, the electrode terminal portions 34a can be formed exactly by using the base 191, whereby the SAW device can be mounted easily with reliability.

Embodiment 11

Figure 20A:
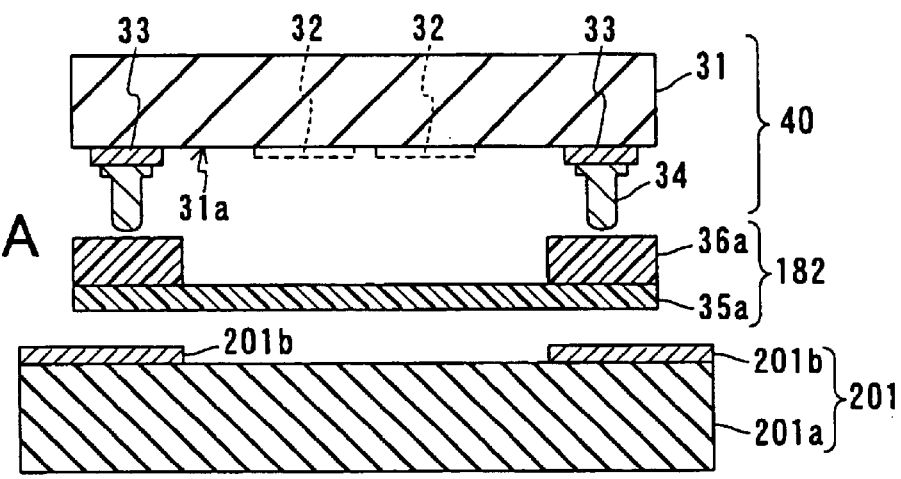
FIGS. 20A and 20B are cross-sectional views showing still another exemplary method for producing a SAW device of the present invention.
Figure 20B:
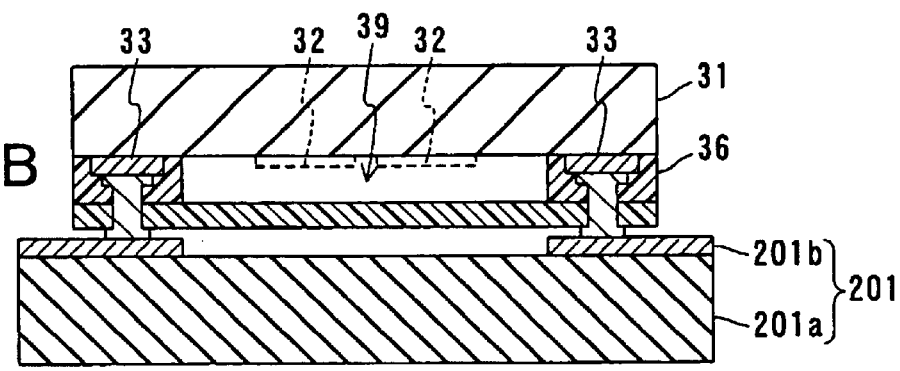

In Embodiment 11, still another example of the SAW device and the method for producing the same of the present invention will be described. FIGS. 20A and 20B are cross-sectional views showing the processes of the production method of Embodiment 11.

First, as shown in FIG. 20A, the carrier 182 and the SAW element 40 are opposed to each other above a wiring board 201. The wiring board 201 includes a substrate 201a and electrodes 201b formed on the substrate 201a. The substrate 201a is made of, for example, glass epoxy, paper epoxy, paper phenol, aramid resin, or ceramics. The electrodes 201b may be made of, for example, gold and plated with tin. The wiring board 201 may be a printed board, or a ceramic board with a circuit built therein. The SAW element 40 and the carrier 182 are the same as those described above.

Next, as shown in FIG. 20B, the bumps 34 are allowed to penetrate through the carrier 182, and the bumps 34 and the electrodes 201b are connected electrically to each other. The conditions at this time are varied depending upon the material for the electrodes 201b.

In the case where the bumps 34 and the electrodes 201b are made of gold, they can be connected to each other electrically and mechanically by a solid-phase diffusion reaction of gold. The solid-phase diffusion reaction of gold can be effected, for example, by heating the wiring board 201 to about 120° C. to 300° C. and applying an ultrasonic wave. In the case where the piezoelectric substrate 31 is made of a material with a high pyroelectric coefficient, it is required to set a heating temperature at 200° C. or lower so as to avoid pyroelectric damage. In the case where a quartz substrate with a low pyroelectric coefficient is used as the piezoelectric substrate 31, the substrate can be heated to about 300° C. Furthermore, the heating temperature also is limited by the material for the side wall 36 and the insulating sheet 35. In the case where the heating temperature is low (i.e., about 120° C.), it is required to apply an ultrasonic wave of about 1 n (W) (n is the number of the bumps 34).

In the case where the bumps 34 are made of gold, and the electrodes 201b are made of gold plated with tin, they can be connected to each other electrically and mechanically only by applying an ultrasonic wave without heating. More specifically, the bumps 34 and the electrodes 201b can be connected to each other electrically and mechanically by applying an ultrasonic wave of 0.2 n (W). If heating is conducted at this time, the SAW element 40 can be mounted easily. However, it is preferable that the heating is conducted in such a range as not to degrade the characteristics of the SAW element 40. Gold of the bumps 34 and tin of the electrodes 201b form an eutectic during the later reflow process to form a strong junction.

Embodiment 12

Figure 21A:
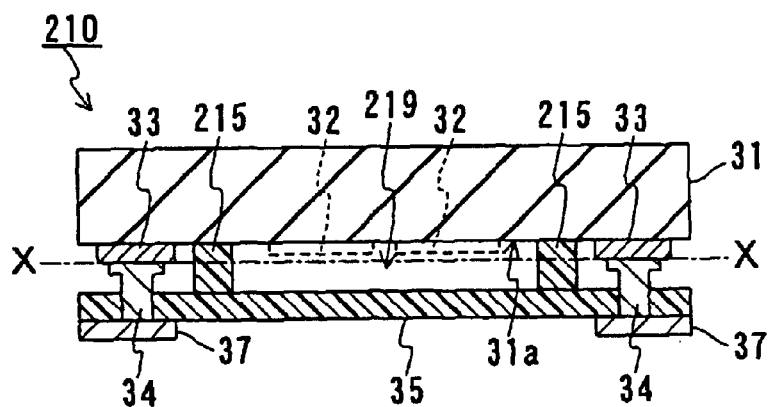
FIGS. 21A and 21B are cross-sectional views showing still another exemplary SAW device of the present invention.
Figure 21B:
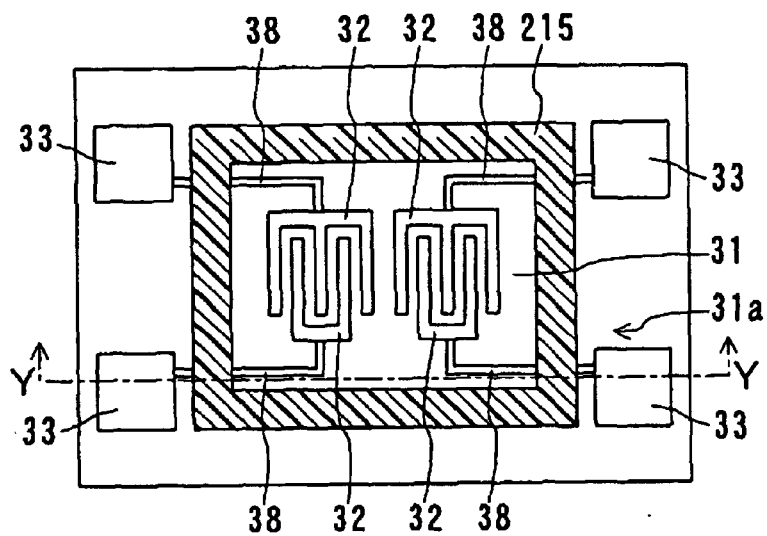

In Embodiment 12, still another example of the SAW device of the present invention will be described. FIGS. 21A and 21B are cross-sectional views of a SAW device 210 of Embodiment 12. FIG. 21A is a cross-sectional view (wiring lines 38 are omitted) taken along a line Y—Y in FIG. 21B. FIG. 21B is a cross-sectional view of the piezoelectric substrate 31 side, taken along a line X—X in FIG. 21A.

The SAW device 210 includes a side wall 215 disposed around the comb electrodes 32. The side wall 215 is made of the same material as that of the side wall 36. The side wall 215 is disposed at the same position as that of the partition wall 101 in FIG. 10B. The piezoelectric substrate 31, the side wall 215, and the insulating sheet 35 form an enclosed space 219. In the SAW device 210, the side wall 215 is disposed on the inner side of the bumps 34. The bumps 34 do not penetrate through the side wall 215, and penetrate through only the insulating sheet 35.

Hereinafter, a method for producing the SAW device 210 will be described. The SAW device 210 can be produced by the same method as that described in Embodiment 4, except for the production process of the side wall 215.

The side wall 215 may be formed on the piezoelectric substrate 31 or the insulating sheet 35. In the case where the side wall 215 is formed on the piezoelectric substrate 31, the side wall 215 can be formed by photolithography using photosensitive resin. Because of this, the side wall 215 can be formed at a predetermined position with good precision, which enables the device to be miniaturized and the production yield to be enhanced. In the case where the side wall 215 is formed on the insulating sheet 35, the side wall 215 can be formed by the same method as that of the side wall 36.

According to the production method of the SAW device 210, it is not required to allow the bumps 34 to penetrate through the side wall. Therefore, the conditions for the mounting process can be controlled easily.

Figure 22A:
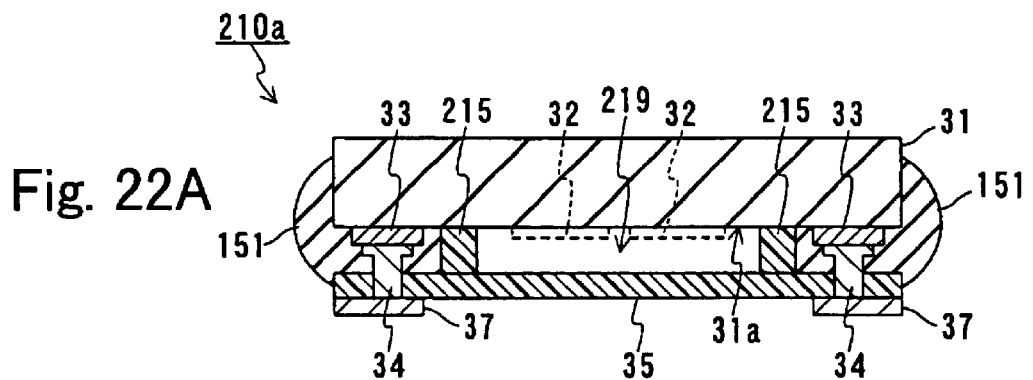
FIGS. 22A and 22B are cross-sectional views showing still another exemplary SAW device of the present invention.
Figure 22B:
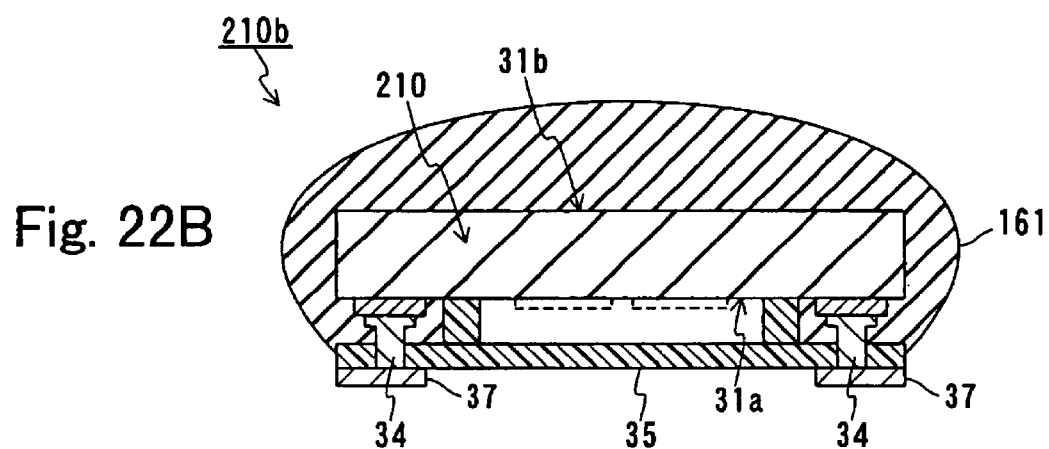

A protective member may be formed so as to cover the side face of the SAW device 210 and the principal plane 31*b* of the piezoelectric substrate 31. FIG. 22A is a cross-sectional view of a SAW device 210*a* in which the protective member 151 is formed only on the side face of the device. FIG. 22B is a cross-sectional view of a SAW device 210*b* in which the protective member 161 is formed so as to cover the side face of the device and the principal plane 31*b*. By forming a protective member, moisture resistance and shock resistance of the device are enhanced.

Figure 23:
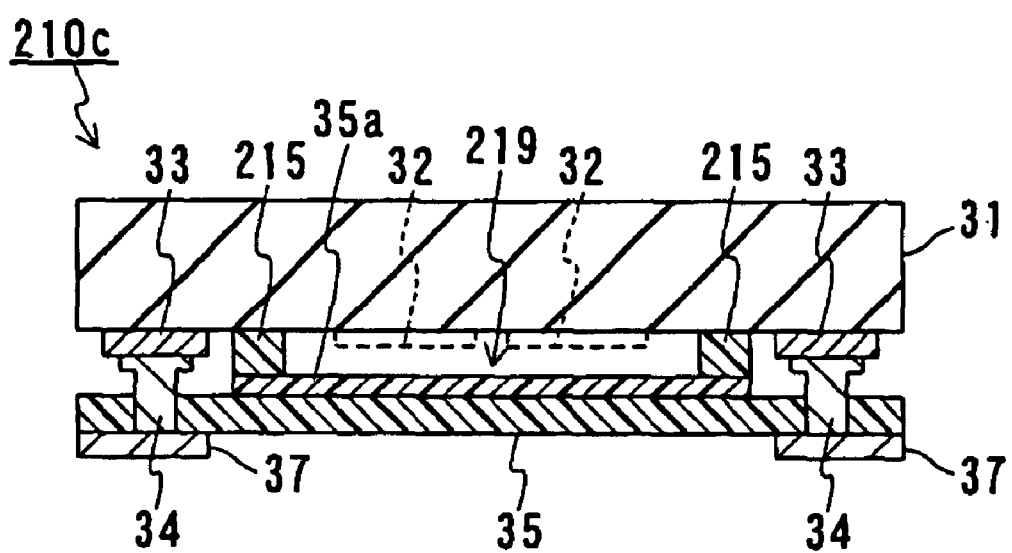
FIG. 23 is a cross-sectional view showing still another exemplary SAW device of the present invention.

Furthermore, the insulating sheet 35 may have a roof portion 35*b*. FIG. 23 is a cross-sectional view of such a SAW device 210*c*. In the SAW device 210*c*, the piezoelectric substrate 31, the side wall 215, and the roof portion 35*b* form an enclosed space 219. A protective member may be formed on the periphery of the SAW device 210*c* in the same way as in the SAW devices 210*a* and 210*b*.

Embodiment 13

Figure 24:
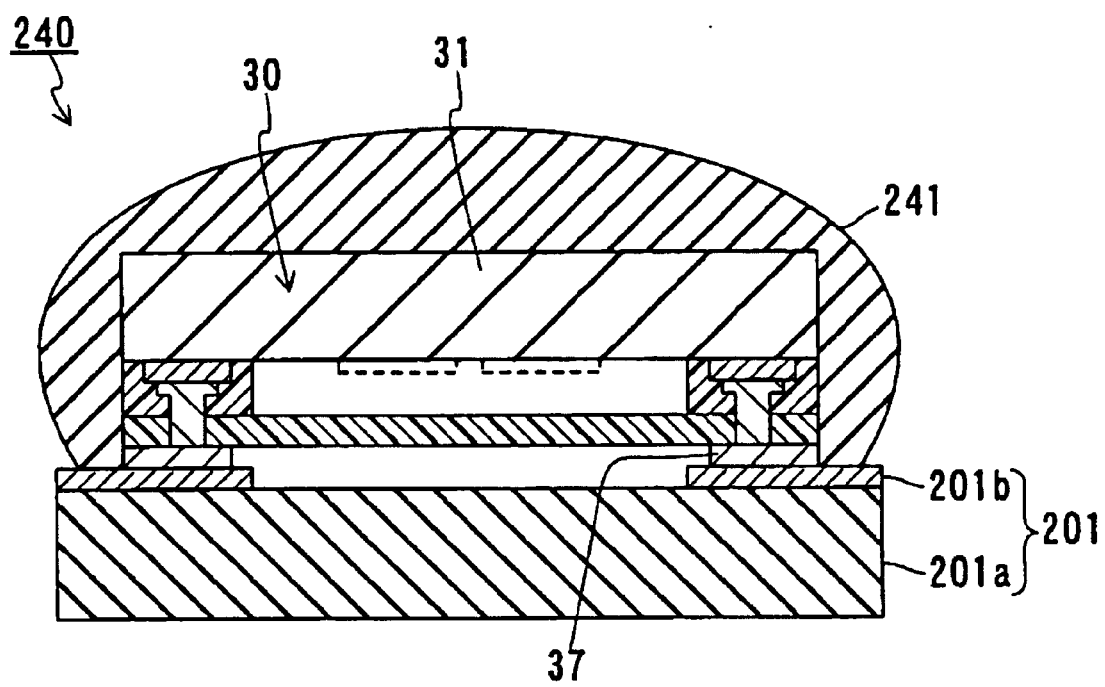
FIG. 24 is a cross-sectional view showing an example of a circuit module of the present invention.

In Embodiment 13, an example of a circuit module of the present invention will be described. FIG. 24 is a cross-sectional view of a circuit module 240 of Embodiment 13. The circuit module 240 includes the wiring board 201, the SAW device 30, and the protective member 241.

A circuit component such as a functional element may be mounted on the wiring board 201. More specifically, discrete components and semiconductor integrated circuits such as a resistor, a capacitor, a coil, and a diode may be mounted. The SAW device 30 can be mounted, for example, by soldering the external electrodes 37 to the electrodes 201*b* of the wiring board 201. In the circuit module 240, the insulating sheet 35 is made of a material with low stiffness, so that the insulating sheet 35 absorbs stress caused by soldering. Therefore, in the circuit module 240, the thin piezoelectric substrate 31 can be used.

The SAW device 30 is covered with a protective member 241. The protective member 241 can be made of the same material as that of the protective member 151.

Figure 25:
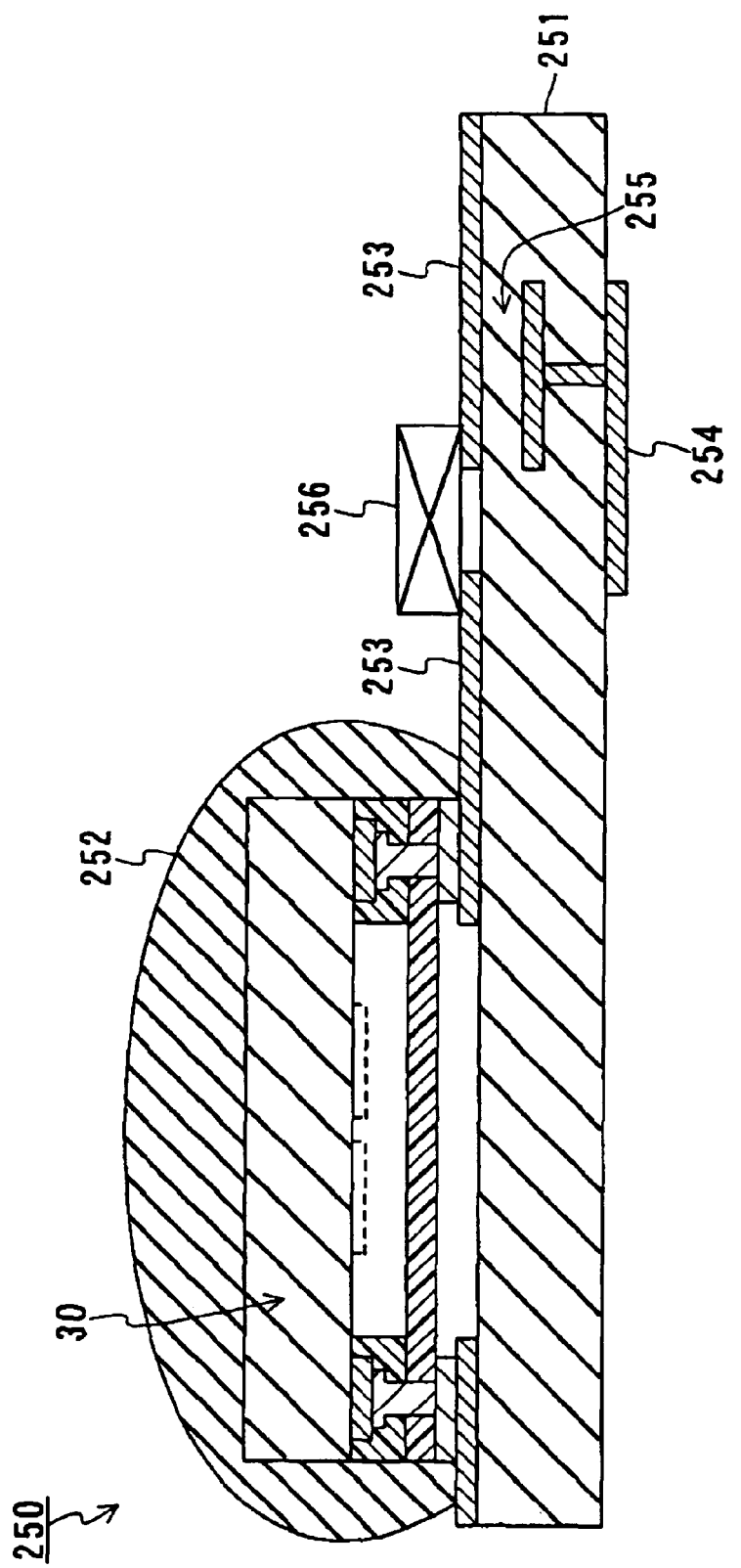
FIG. 25 is a cross-sectional view showing another example of a circuit module of the present invention.

A layered ceramic substrate with an electronic component built therein may be used in place of the wiring board 201. FIG. 25 is a schematic cross-sectional view of such a circuit module 250.

The circuit module 250 includes a layered ceramic substrate 251, the SAW device 30, a protective member 252, and a circuit component. Wiring lines 253 and a ground electrode 254 are formed on the surface of the layered ceramic substrate 251. A capacitive element 255 is formed in the layered ceramic substrate 251. The SAW device 30 and the resistance element 256 (hatching is omitted) are mounted on the wiring lines 253.

The SAW device 30 is covered with the protective member 252. The protective member 252 can be made of the same material as that of the protective member 151.

The SAW device mounted on the wiring board 201 and the layered ceramic substrate 251 is not limited to the SAW device 30, and another SAW device of the present invention may be mounted.

Embodiment 14

In Embodiment 14, still another example of the SAW device of the present invention will be described. The SAW device of Embodiment 14 includes a piezoelectric substrate, a plurality of comb electrodes for exciting a surface acoustic wave disposed on one principal plane of the piezoelectric substrate, a plurality of bumps disposed on the principal plane, and a member containing resin disposed on the principal plane side. The bumps and the comb electrodes are connected electrically to each other. At least a part of the bumps is buried in the member.

The SAW device of Embodiment 14 further includes a circuit board disposed so as to be opposed to the principal plane of the piezoelectric substrate. The circuit board includes wiring lines formed on the surface of the piezoelectric substrate side. The member containing resin is a space forming member for forming a space, which allows the comb electrodes to vibrate, on the periphery of the comb electrodes.

The SAW device of Embodiment 14 includes various modifications of SAW devices as described in the following embodiments. In the following embodiments, a space forming member in a frame shape is shown. However, the space forming member may not surround the periphery of the comb electrodes. For example, the space forming member may have a column shape. In this case, the space on the periphery of the comb electrodes is formed into an enclosed space with resin disposed so as to cover the periphery of the space forming member.

Embodiment 15

In Embodiment 15, an example of the method for producing a SAW device of the present invention will be described.

According to the production method of Embodiment 15, (i) a piezoelectric substrate, a plurality of comb electrodes formed on one principal plane of the piezoelectric substrate, a SAW element having a plurality of bumps connected electrically to a plurality of comb electrodes, and a circuit board having one principal plane with wiring lines formed thereon are formed. Thereafter, (ii) the principal plane of the piezoelectric substrate and the principal plane of the circuit board are disposed so as to be opposed to each other with a space forming member interposed therebetween. Thereafter, (iii) the circuit board and the SAW element are brought closer together so that the bumps are buried in the space forming member to be connected electrically to the wiring lines. In the process (iii), the space forming member forms a space, which allows the comb electrodes to vibrate, on the periphery of the comb electrodes.

The production method of Embodiment 15 is an exemplary production method of the present invention, and the production method of the present invention includes various modifications as described in the following embodiments. According to the production method of the present invention, the members described in Embodiment 1, for example, a piezoelectric substrate, comb electrodes, electrode pads, bumps, an insulating sheet, a side wall, external electrodes, and wiring lines can be used.

Embodiment 16

Figure 26:
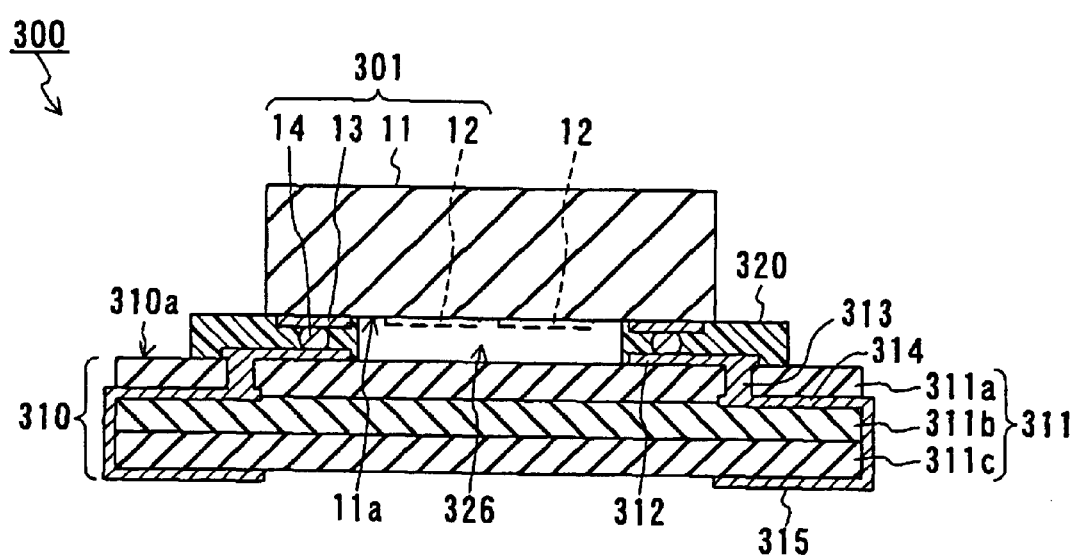
FIG. 26 is a cross-sectional view showing still another exemplary SAW device of the present invention.

In Embodiment 16, an example of the SAW device of Embodiment 14 and the method for producing the same will be described. FIG. 26 is a cross-sectional view of a SAW device 300 of Embodiment 16.

The SAW device 300 includes a SAW element 301, a circuit board 310, and a space forming member 320. The SAW element 301 is the same as that contained in the SAW device 10. The SAW element 301 includes a piezoelectric substrate 11, a plurality of electrodes 12 formed on the piezoelectric substrate 11, electrode pads 13, and a plurality of bumps 14 formed on the electrode pads 13.

The space forming member 320 is made of resin. The space forming member 320 is provided with a through-hole or a concave portion for forming a space that allows the comb electrodes 12 to vibrate. The space forming member 320 is disposed between the piezoelectric substrate 11 and the circuit board 310. The circuit board 310, the piezoelectric substrate 11, and the space forming member 320 form an enclosed space, which allows the comb electrodes 12 to vibrate, on the periphery of the comb electrodes 12.

The circuit board 310 includes a base 311, wiring lines 312, via electrodes 313, internal electrodes 314, and external electrodes 315. The base 311 is a layered body in which layers 311a to 311c made of an insulator are layered. The wiring lines 312 are formed on one principal plane 310a of the circuit board 310. The via electrodes 313 and the internal electrodes 314 are formed in the base 311. The internal electrodes 314 are formed in the base 311 in a layer shape. The via electrodes 313 connect the wiring lines 312, the internal electrodes 314, and the external electrodes 315 electrically to each other. The bumps 14 penetrate through the space forming member 320 to be connected directly to the wiring lines 312. It is preferable that the bumps 14 and the wiring lines 312 are connected to each other by applying an ultrasonic wave. The comb electrodes 12 are connected electrically to the external electrodes 315 via the electrode pads 13, the bumps 14, the wiring lines 312, the via electrodes 313, and the internal electrodes 314. Furthermore, the SAW element 301 is fixed to the circuit board 310 by the bumps 14 and the space forming member 320.

In the SAW device 300, a container for hermetically sealing the SAW element 301 is not required, so that the device can be miniaturized and reduced in height. Furthermore, in the SAW device 300, the space forming member 320 and the bumps 14 support the SAW element 301 on the circuit board 310; therefore, the SAW element can be supported stably.

Hereinafter, a method for producing the SAW device 300 will be described with reference to FIGS. 27A and 27B. First, the SAW element 301, the circuit board 310, and the space forming member 320 are produced (Process (i)). Each constituent portion may be produced in any order or simultaneously. A method for producing each constituent portion will be described below.

First, the process of producing the circuit board 310 will be described. The circuit board 310 includes the base 311 made of layered ceramic dielectrics. The base 311 can be formed by sintering a ceramic green sheet. As the base 311, a glass epoxy resin substrate may be used. The wiring lines 312, the internal electrodes 314, and the external electrodes 315 can be formed by a general method for forming wiring. The via electrodes 313 can be formed by forming via holes in the base 311, and filling the via holes with a metal paste, followed by sintering. The wiring lines 312 and the external electrodes 315 may be connected to each other via functional circuits such as an inductor, a capacitor, a phase-shift circuit, a balun, and a low-pass filter. These functional circuits may be disposed in the base 311.

Next, the process of producing the space forming member 320 will be described. The space forming member 320 has a through-hole or a concave portion for forming a space that allows the comb electrodes 12 to vibrate. The space forming member 320 can be formed by a general method. For example, the space forming member 320 can be produced by forming a through-hole mechanically at a central portion of a resin plate. The space forming member 320 also can be produced by flowing uncured resin to a mold with a hollow portion and partially curing the resin. The space forming member 320 provided with a concave portion also can be produced by attaching a plate with a through hole to a flat plate.

The space forming member 320 preferably is made of thermosetting resin (e.g., epoxy resin). In order to control the characteristics of the space forming member 320 such as a thermal deformation property, viscosity, and modulus of elasticity, the space forming member 320 may contain a solid filling.

Next, the process of producing the SAW element 301 will be described. The SAW element 301 can be formed by the same method as that of the SAW element 40 described in Embodiment 4. The bumps 14 can be formed by ball bonding using gold wires as described in Embodiment 4. It is preferable that the bumps 14 are made of easily deformable gold in order to conduct electrical connection with high reliability. Furthermore, the bumps 14 preferably have a two-stage structure with pointed ends so as to penetrate easily through the space forming member 320. The height of the bumps 14 preferably is larger than the thickness of the space forming member 320. By setting the height of the bumps 14 in a predetermined range, the bumps 14 and the wiring lines 312 can be connected to each other with reliability without deforming the space forming member 320.

Next, the process of producing the SAW device 300 by combining the SAW element 301, the circuit board 310, and the space forming member 320 will be described.

Figure 27A:
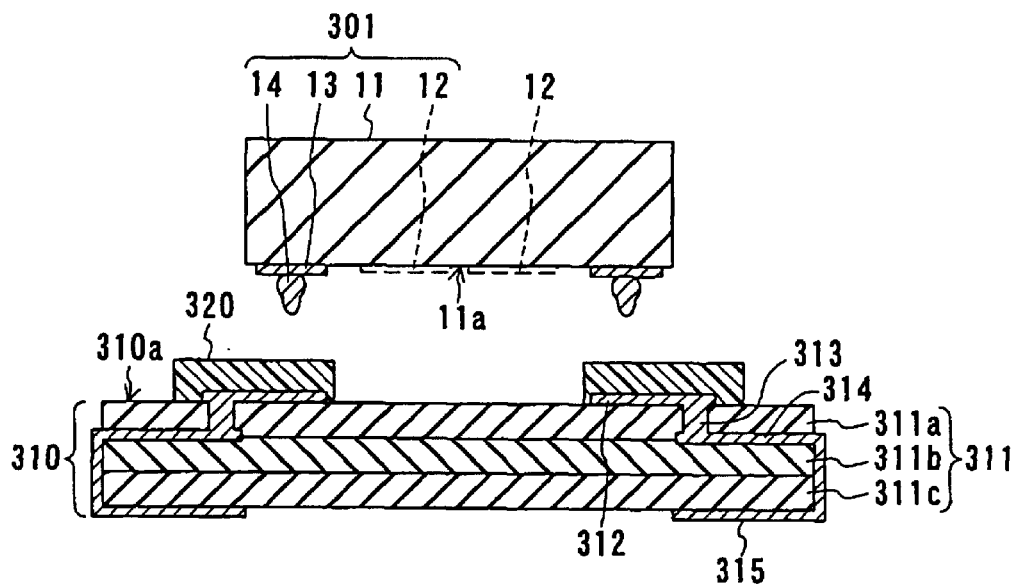
FIGS. 27A and 27B are cross-sectional views showing still another exemplary method for producing a SAW device of the present invention.

First, as shown in FIG. 27A, the space forming member 320 is crimped onto one principal plane 310a of the circuit board 310 by heating. The space forming member 320 is disposed so as to cover at least a part of the wiring lines 312 where the bumps 14 are connected. The conditions of crimping by heating, such as temperature and pressure, are selected depending upon the kind of resin to be used so that the space forming member 320 can form a predetermined space. For example, crimping by heating can be conducted under the conditions of a heating temperature of 50° C. and a pressure of $1.47 \times 10^5$ Pa. In the case of using the space forming member 320 in which a concave portion is formed instead of a through-hole, the side of the space forming member 320 on which the concave portion is not formed is crimped onto the circuit board 310 by heating.

It is preferable that, after forming the space forming member 320, the space forming member 320 is subjected to a heat treatment to remove a gas component contained in resin forming the space forming member 320. The characteristics of the SAW device 300 can be prevented from being fluctuated by removing a gas component contained in the space forming member 320. In this case, the conditions of a heat treatment can be selected variously in accordance with the resin forming the space forming member 320. For example, the heat treatment can be conducted at 100° C. for 2 hours.

Thereafter, as shown in FIG. 27A, the principal plane 11a of the piezoelectric substrate 11 and the principal plane 310a of the circuit board 310 are opposed to each other with the space forming member 320 interposed therebetween.

Figure 27B:
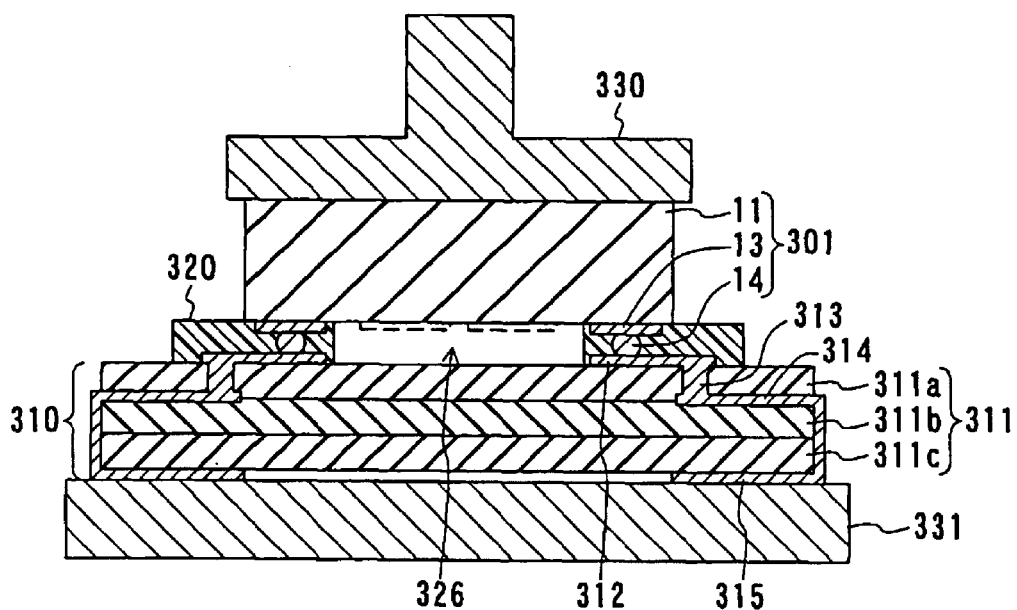

Then, as shown in FIG. 27B, the circuit board 310 and the SAW element 301 are brought closer together so that the bumps 14 are connected directly to the wiring lines 312 through the space forming member 320. During this process, an enclosed space 326 that allows the comb electrodes 12 to vibrate is formed on the periphery of the comb electrodes 12. More specifically, after the circuit board 310 is placed on a stage 331, the reverse side of the piezoelectric substrate 11 is pressed with a press stage 330 so that the bumps 14 penetrate through the space forming member 320. Pressing is conducted until the bumps 14 and the wiring lines 312 are brought into contact with each other. At this time, a pressure may be applied to such a degree that contraction stress is applied slightly to the space forming member 320. Because of this, the bumps 14 are subjected to plastic deformation to fix the SAW element 301, and the bumps 14 and the wiring lines 312 can be connected electrically to each other. By subjecting the bumps 14 to plastic deformation, the bumps 14 and the wiring lines 312 can be connected with reliability. By setting the height of the bumps 14 to be larger than the thickness of the space forming member 320, the bumps 14 can be subjected to plastic deformation when the SAW element 301 and the circuit board 310 are brought closer together.

In the process of connecting the bumps 14 to the wiring lines 312, it is preferable that at least one portion of the SAW element 301 and the space forming member 320 is heated so that the bumps 14 easily penetrate through the space forming member 320. Furthermore, during this process, an ultrasonic wave is applied to a connection point between the bumps 14 and the wiring lines 312, whereby the bumps 14 and the wiring lines 312 may be subjected to ultrasonic bonding. Due to the ultrasonic bonding, electrical connection can be conducted with particular reliability. The conditions of applying an ultrasonic wave can be selected variously. In the SAW device 300, the SAW element 301 is fixed with the space forming member 320 and the bumps 14, so that the SAW element 301 can be fixed more stably, compared with the conventional method of fixing the SAW element only with the bumps 14. Therefore, in the case of producing the SAW device 300, an ultrasonic wave output for fixing the bumps 14 can be decreased. As a result, the piezoelectric substrate 11 of the SAW element 301 can be prevented from cracking due to shock.

Furthermore, it is preferable that, after the process of FIG. 27B, the resin contained in the space forming member 320 is cured by a heat treatment to enhance the adhesiveness between the SAW element 301 and the space forming member 320, and the adhesiveness between the space forming member 320 and the circuit board 310. This heat treatment can be selected depending upon the material for the space forming member 320, and can be conducted at 150° C. for 1 hour, for example. Because of this heat treatment, the air-tightness of the closed space 326 can be enhanced. During the heat treatment, the bumps 14 and the wiring lines 312 are connected to each other, and contraction stress slightly acts on the space forming member 320. Therefore, it is not required to conduct compression. Thus, the SAW device 300 can be produced with good productivity.

The space forming member 320 is cured by a heat treatment, whereby the highly reliable SAW device 300 that is resistant to mechanical shock can be obtained. Furthermore, in the case where the space forming member 320 is larger than the outer dimensions of the SAW element 301, the resin contained in the space forming member 320 comes to the side face of the SAW element 301 by a heat treatment, whereby the air-tightness of the closed space 326 can be enhanced.

According to the production method of Embodiment 16, the SAW device 300 with the SAW element 301 strongly fixed thereto is obtained.

Embodiment 17

Figure 28:
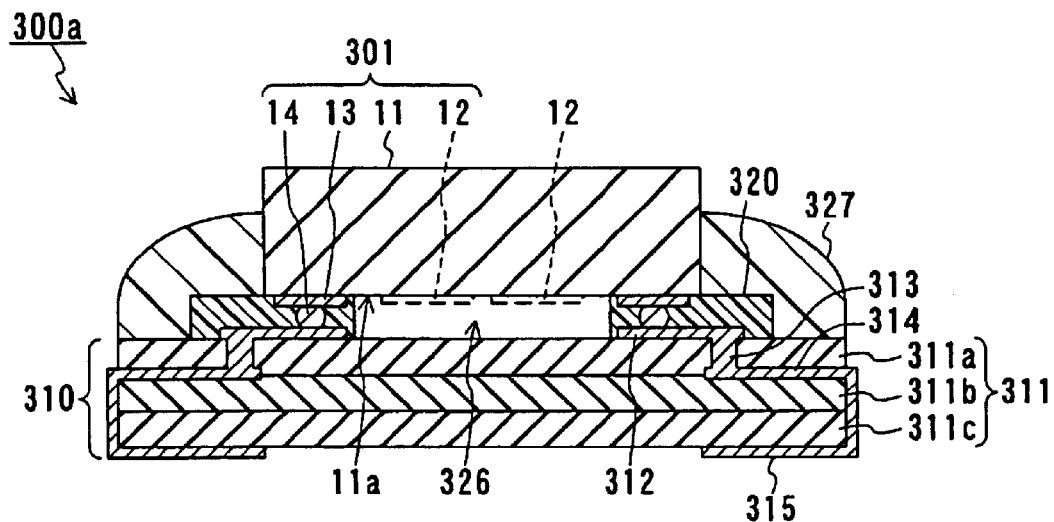
FIG. 28 is a cross-sectional view showing still another exemplary SAW device of the present invention.

In Embodiment 17, an example of the SAW device described in Embodiment 14 will be described. FIG. 28 is a cross-sectional view of a SAW device 300a of Embodiment 17.

The SAW device 300a is different from the SAW device 300 of Embodiment 16, in that the SAW device 300a includes a protective member 327 disposed so as to cover the periphery of the space forming member 320. The protective member 327 can be made of the same material as that of the protective member 151. In the SAW device 300a, the protective member 327 can enhance air-tightness of the enclosed space 326 and prevent moisture from entering the enclosed space 326.

It is preferable that the coefficient of thermal expansion of the material for the protective member 327 is in a range of 0.8 to 1.2 times that of the material for the circuit board 310. Because of this, even if operation environment is varied, the protective member 327 and the circuit board 310 will not be deformed due to the difference in coefficient of thermal expansion. As a result, a SAW device whose characteristics are unlikely to be degraded due to changes in temperature is obtained.

Embodiment 18

Figure 29:
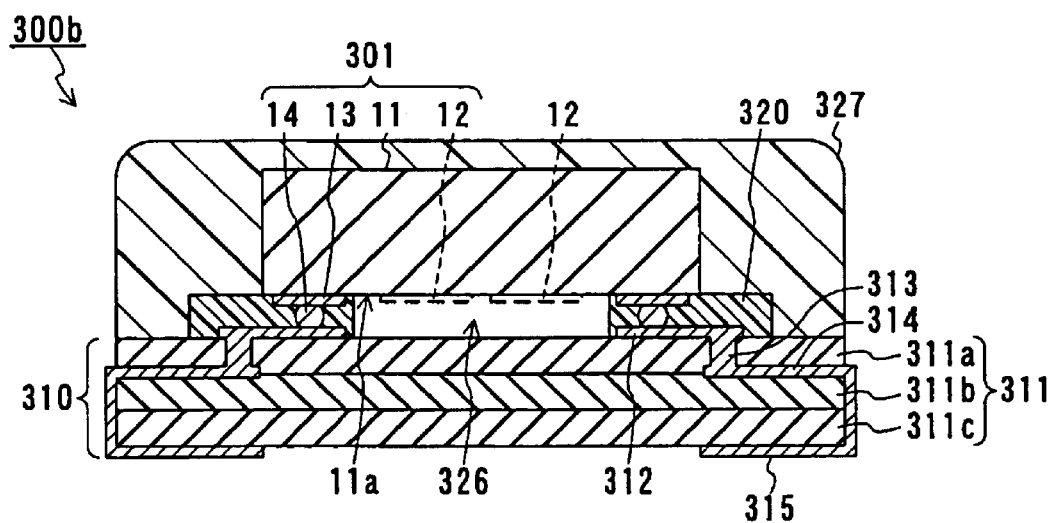
FIG. 29 is a cross-sectional view showing still another exemplary SAW device of the present invention.

In Embodiment 18, another example of the SAW device described in Embodiment 14 will be described. FIG. 29 is a cross-sectional view of a SAW device 300b of Embodiment 18.

The SAW device 300b is different from the SAW device 300a of Embodiment 17, in that the protective member 327 covers not only the periphery of the space forming member 320 but also the reverse surface of the SAW element 301. In other words, the SAW device 300b includes a first protective member disposed on the periphery of the space forming member 320 and a second protective member disposed so as to cover a principal plane of the piezlelectric substrate 11 opposite to the principal plane 11a. In the SAW device 300b, the first and second protective members are formed as a unit.

In the SAW device 300b, the SAW element 301 is fixed strongly to the circuit board 310, and the protective member 327 covers the piezoelectric substrate 11. Therefore, even in the case where a brittle material such as lithium tantalate is used as the piezoelectric substrate 11, the influence of mechanical shock and thermal shock can be reduced.

Embodiment 19

Figure 30:
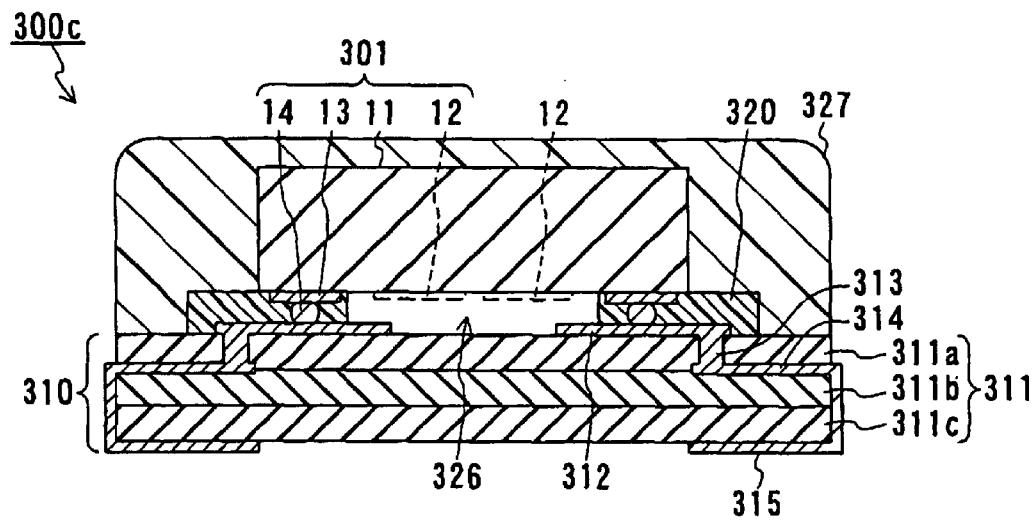
FIG. 30 is a cross-sectional view showing still another exemplary SAW device of the present invention.

In Embodiment 19, still another example of the SAW device described in Embodiment 14 will be described. FIG. 30 is a cross-sectional view of a SAW device 300c of Embodiment 19.

The SAW device 300c is different from the SAW device 300b of Embodiment 18, in that the wiring lines 312 on the circuit board 310 are formed to the inside of the enclosed space 326. In the SAW device 300c, because of the wiring lines 312 disposed in an opening of the space forming member 320, the circuit board 310 and the SAW element 310 can be aligned with good precision in assembling the SAW device. Separately from the wiring lines 312, a pattern for recognizing the position of the circuit board 310 may be formed on the circuit board 310. This pattern can be formed by the same method as that of the wiring lines 312.

Embodiment 20

Figure 31:
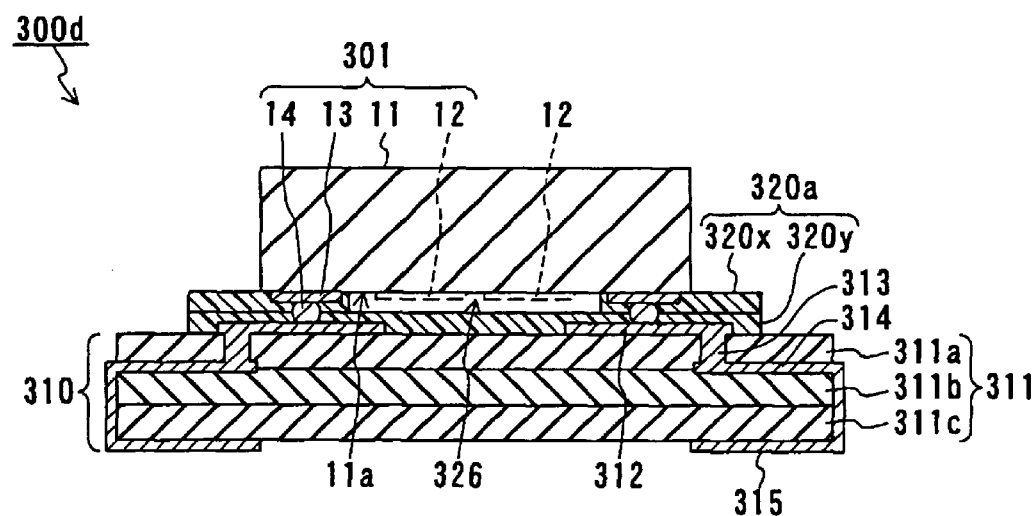
FIG. 31 is a cross-sectional view showing still another exemplary SAW device of the present invention.

In Embodiment 20, still another example of the SAW device described in Embodiment 14 will be described. FIG. 31 is a cross-sectional view of a SAW device 300d of Embodiment 20.

The SAW device 300d is different from the SAW device 300 of Embodiment 16 only in a space forming member. A space forming member 320a of the SAW device 300d is composed of a first member 320x and a second member 320y. A through-hole is formed at a central portion of the first member 320x. As the first member 320x, the space forming member 320 described in Embodiment 16, which is made thinner, can be used. As the second member 320y, a resin sheet can be used. The second member 320y may be provided with a concave portion on the circuit board 310 side, if required. The first member 320x is stacked on the second member 320y, and the through-hole of the first member 320x forms a concave portion. The concave portion forms a space that allows the comb electrodes 12 to vibrate.

The space forming member 320a may be crimped onto the circuit board 310 by heating in the same way as in the space forming member 320. Furthermore, after the second member 320y is crimped onto the circuit board 310 by heating, the first member 320x may be crimped onto the second member 320y by heating.

The SAW device 300d is provided with the second member 320y in a sheet shape, so that metal powder is prevented from peeling off from the circuit board 310 to adhere to the comb electrodes 12. This prevents the comb electrodes 12 from being short-circuited, whereby a SAW device with high reliability can be obtained.

Embodiment 21

Figure 32:
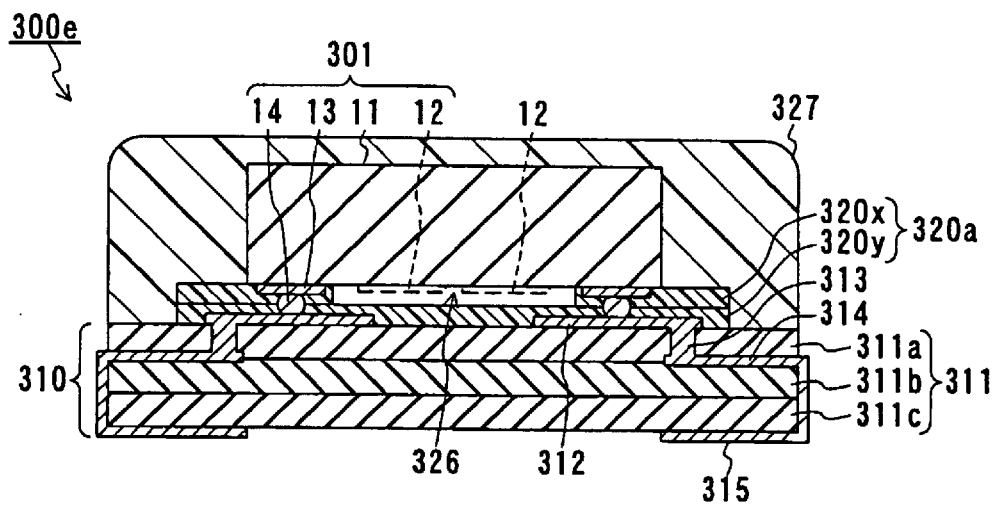
FIG. 32 is a cross-sectional view showing still another exemplary SAW device of the present invention.

In Embodiment 21, still another example of the SAW device described in Embodiment 14 will be described. FIG. 32 is a cross-sectional view of a SAW device 300e of Embodiment 21.

The SAW device 300e is different from the SAW device 300d of Embodiment 20, in that the protective member 327 covers the periphery of the space forming member 320a and the reverse surface of the SAW element 301. The protective member 327 is the same as that described in Embodiment 18. In the SAW device 300e, the effects described in Embodiment 18 are obtained in addition to those obtained by the SAW device 300d.

Figure 33:
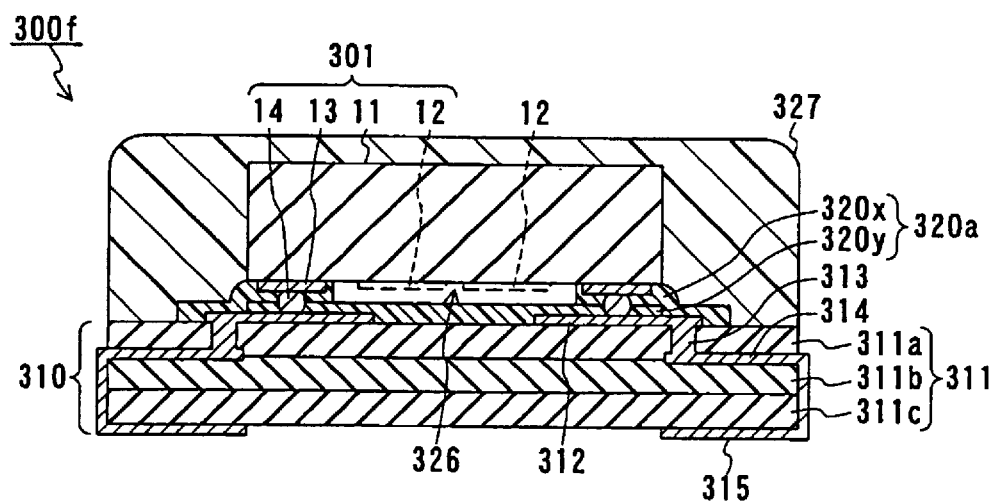
FIG. 33 is a cross-sectional view showing still another exemplary SAW device of the present invention.

The first member 320x may be larger than the second member 320y. FIG. 33 is a cross-sectional view of a SAW device 300f with such a configuration. In the SAW device 300f, the first member 320x is disposed so as to cover the second member 320y. The first member 320x may cover the surface of the circuit board 310.

Embodiment 22

Figure 34:
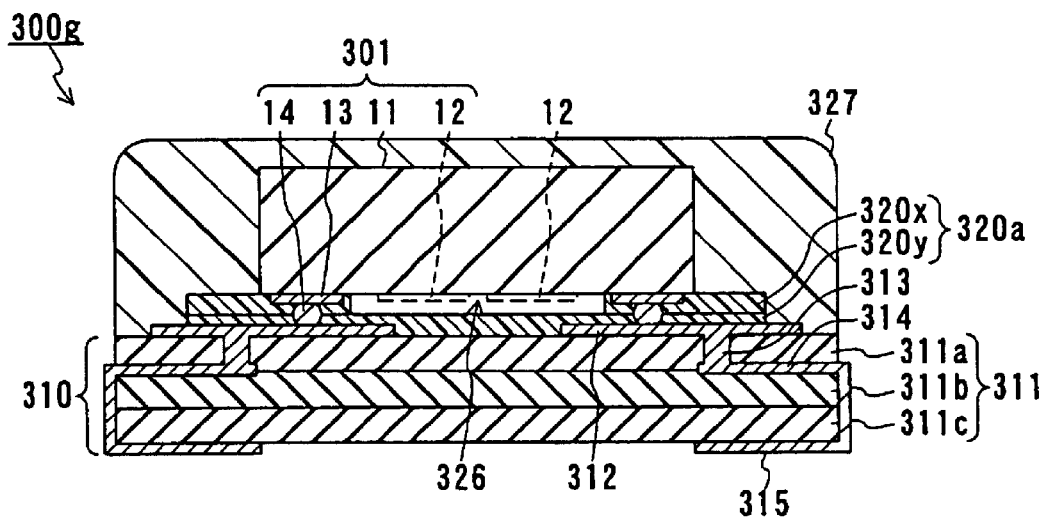
FIG. 34 is a cross-sectional view showing still another exemplary SAW device of the present invention.

In Embodiment 22, still another example of the SAW device described in Embodiment 14 will be described. FIG. 34 is a cross-sectional view of a SAW device 300g of Embodiment 22.

The SAW device 300g is different from the SAW device 300e of Embodiment 21, in that the wiring lines 312 are formed to the outside of the space forming member 320a. Therefore, in the process of assembling the SAW device 300g, alignment of the circuit board 310 can be conducted exactly, by using the wiring lines 312 disposed outside of the space forming member 320a. Separately from the wiring lines 312, a pattern for alignment may be formed outside of the space forming member 320a.

Embodiment 23

Figure 35:
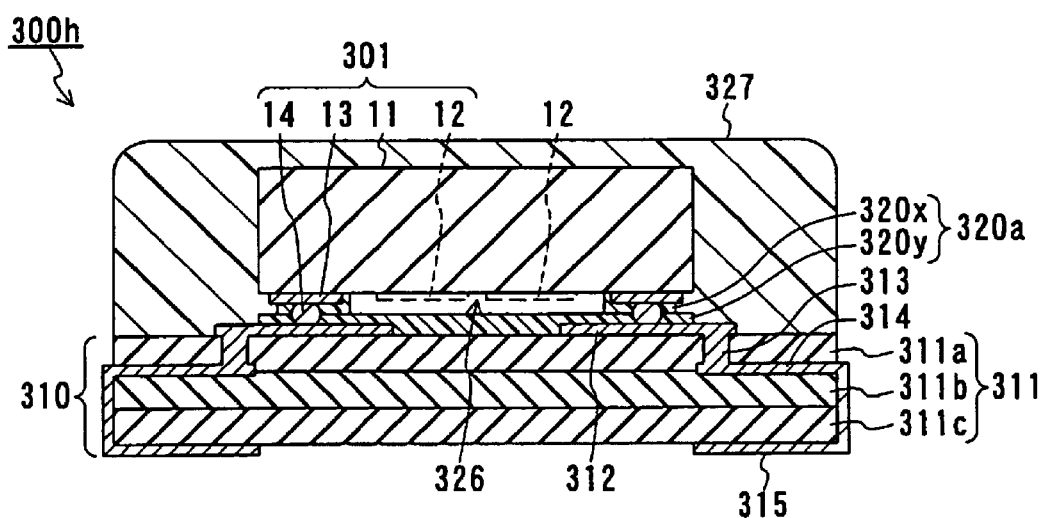
FIG. 35 is a cross-sectional view showing still another exemplary SAW device of the present invention.

In Embodiment 23, still another example of the SAW device described in Embodiment 14 will be described. FIG. 35 is a cross-sectional view of a SAW device 300h of Embodiment 23.

The SAW device 300h is different from the SAW device 300e, in that the second member 320y of the space forming member 320a has substantially the same size as that of the SAW element 301. The SAW device 300h also is different from the SAW device 300e in a method for forming the space formation member 320a.

In the SAW device 300h, the first member 320x is formed on one principal plane 11a of the piezoelectric substrate 11. The first member 320x is made of photosensitive resin. For example, the first member 320x is made of a liquid resist, a dry film resist, photosensitive polyimide, or the like.

Hereinafter, a method for forming the space forming member 320a will be described. First, the piezoelectric substrate 11, on which the comb electrodes 12, the electrode pads 13, and the wiring lines 18 (see FIG. 1B) are formed, is prepared. Then, the first member 320x is formed on the principal plane 11a of the piezoelectric substrate 11 by patterning photosensitive resin by photolithography. At this time, a through-hole for forming a space that allows the comb electrodes 12 to vibrate is obtained at a central portion of the first member 320x. The bumps 14 may be disposed inside or outside the through-hole.

The second member 320y is formed on the circuit board 310. When the bumps 14 and the wiring lines are connected to each other, the first member 320x and the second member 320y are allowed to adhere to each other.

In the SAW device 300h, the first member 320x can be formed with good precision by photolithography. Therefore, in the SAW device 300h, the first member 320x can be prevented from being deformed, and the device can be miniaturized.

Embodiment 24

Figure 36:
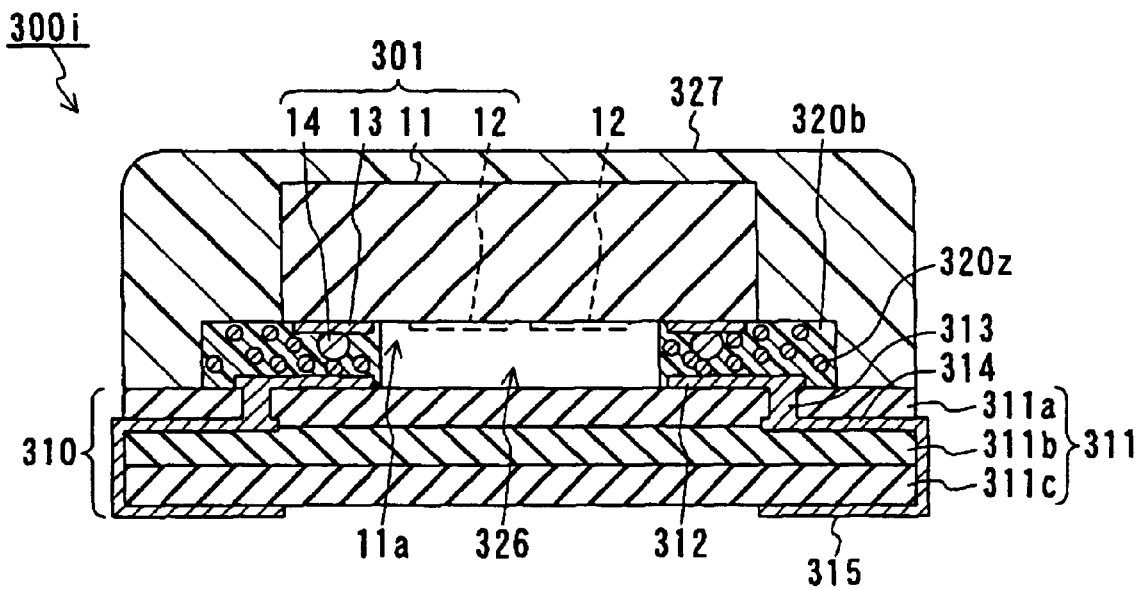
FIG. 36 is a cross-sectional view showing still another exemplary SAW device of the present invention.

In Embodiment 24, still another example of the SAW device described in Embodiment 14 will be described. FIG. 36 is a cross-sectional view of a SAW device 300i of Embodiment 24.

The SAW device 300i is different from the SAW device 300b described in Embodiment 18, in a method for connecting the bumps 14 to the wiring lines 312, and a space forming member.

The space forming member 320b of the SAW device 300i is different from the space forming member 320, in that the space forming member 320b contains a solid filling 320z dispersed in a resin sheet. The solid filling 320z is a solid having conductivity, and there is no particular limit to the material, size, and size distribution. As the solid filling 320z, for example, silver powder, nickel powder, silver-palladium alloy powder, or gold powder can be used. Alternatively, plastic powder plated with nickel or nickel/gold also can be used.

There is no particular limit to the content of the solid filling 320z in the space forming member 320b. However, in order to connect the bumps 14 to the wiring lines 312, a predetermined amount or more of the solid filling 320z is required. The content of the solid filling 320z preferably is 10% by volume or more. By setting the content of the solid filling 320z at a predetermined amount, the bumps 14 and the solid filling 320z can be brought into contact with each other without fail when the bumps 14 are buried in the space forming member 320b. Because of this, the bumps 14 and the wiring lines 312 can be connected electrically to each other via the electrode pads 13, the bumps 14, and the solid filling 320z. On the other hand, when the content of the solid filling 320z becomes too high, the characteristics of the space forming member 320b such as flexibility are degraded. Therefore, it is preferable that the content is set at a predetermined amount or less. More specifically, it is preferable that the content of the solid filling 320z is 50% by volume or less.

In the SAW device 300i, the bumps 14 do not penetrate through the space forming member 320b. The bumps 14 and the wiring lines 312 are not in contact with each other directly, and are connected electrically to each other via the solid filling 320z. According to this configuration, the bumps 14 and the wiring lines 312 can be connected electrically to each other without applying an excess load to the circuit board 310. In the SAW device 300i, the SAW element 301 is fixed by the bumps 14 and the space forming member 320b.

The production method of the SAW device 300i is different from that of the SAW device 300 described in Embodiment 16, in the process of producing the space forming member 320 and the process of electrically connecting the bumps 14 to the wiring lines 312. The processes other than these processes are the same as those of the production method of Embodiment 16. Therefore, repeated description thereof will be omitted here.

First, the process of producing the space forming member 320b will be described. The space forming member 320b can be produced by the same method as that of the space forming member 320, except that the solid filling 320z is dispersed in uncured resin or semi-cured resin.

Next, the process of electrically connecting the bumps 14 to the wiring lines 312 will be described. The bumps 14 are formed so that the height thereof becomes smaller than the thickness of the space forming member 320. The circuit board 310 and the SAW element 301 are brought closer together so that the bumps 14 are connected electrically to the wiring lines 312 via the solid filling 320z. More specifically, the reverse surface of the piezoelectric substrate 11 only needs to be pressed with the press stage 330 in the same way as in FIG. 27B. Pressing is conducted until the principal plane 11a of the piezoelectric substrate 11 and the space forming member 320b are brought into contact with each other. It is preferable that at least one portion of the space forming member 320b and the SAW element 301 is heated so that the bumps 14 easily are buried in the space forming member 320b.

In this process, an ultrasonic wave may be applied to the contact point between the bumps 14 and the solid filling 320z, the contact point between the solid filling 320z and the solid filling 320z, and the contact point between the solid filling 320z and the wiring lines 312. More specifically, the bumps 14 and the solid filling 320z, the solid filling 320z and the solid filling 320z, and the solid filling 320a and the wiring lines 312 may be subjected to ultrasonic bonding. Because of ultrasonic bonding, electrical connection can be conducted with reliability. The conditions of applying an ultrasonic wave can be variously selected.

In the SAW device 300i, the SAW element 301 is fixed by the space forming member 320b and the bumps 14. Therefore, an ultrasonic wave output can be decreased, compared with a conventional method for fixing the SAW element only with the bumps 14. This can prevent the piezoelectric substrate 11 of the SAW element 301 from cracking due to shock.

It also may be possible that, after electrically connecting the bumps 14 to the wiring lines 312, the space forming member 320b is cured by a heat treatment. The conditions of a heat treatment can be selected depending upon the material for the space forming member 320b. More specifically, the heat treatment can be conducted at 150° C. for one hour. This heat treatment enhances the adhesiveness between the principal plane 11a of the piezoelectric substrate 11 and the space forming member 320b, and the adhesiveness between the space forming member 320b and the circuit board 310. This enhances air-tightness of the enclosed space 326.

During the heat treatment, the bumps 14, the solid filling 320z, and the wiring lines 312 are subjected to metal junction, and contraction stress slightly acts on the space forming member 320b. Therefore, the heat treatment can be conducted with good productivity without pressing. By curing the space forming member 320b by a heat treatment, a highly reliable SAW device that is resistant to mechanical shock can be obtained. Furthermore, in the case where the space forming member 320b is larger than the outer dimensions of the SAW element 301, the resin contained in the space forming member 320b comes to the side face of the piezoelectric substrate 11 by the heat treatment, which enhances the air-tightness of the enclosed space 326.

Embodiment 25

Figure 37:
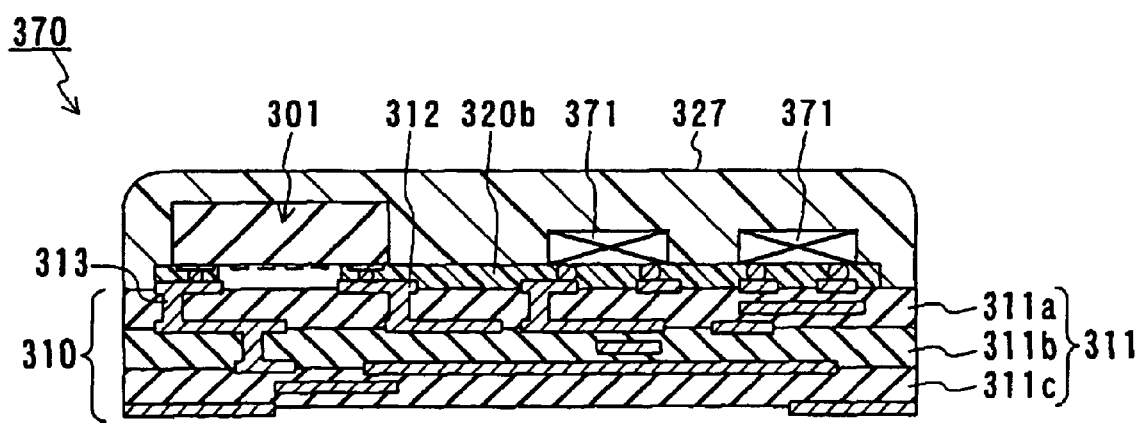
FIG. 37 is a cross-sectional view showing still another example of a circuit module of the present invention.
Figure 38:
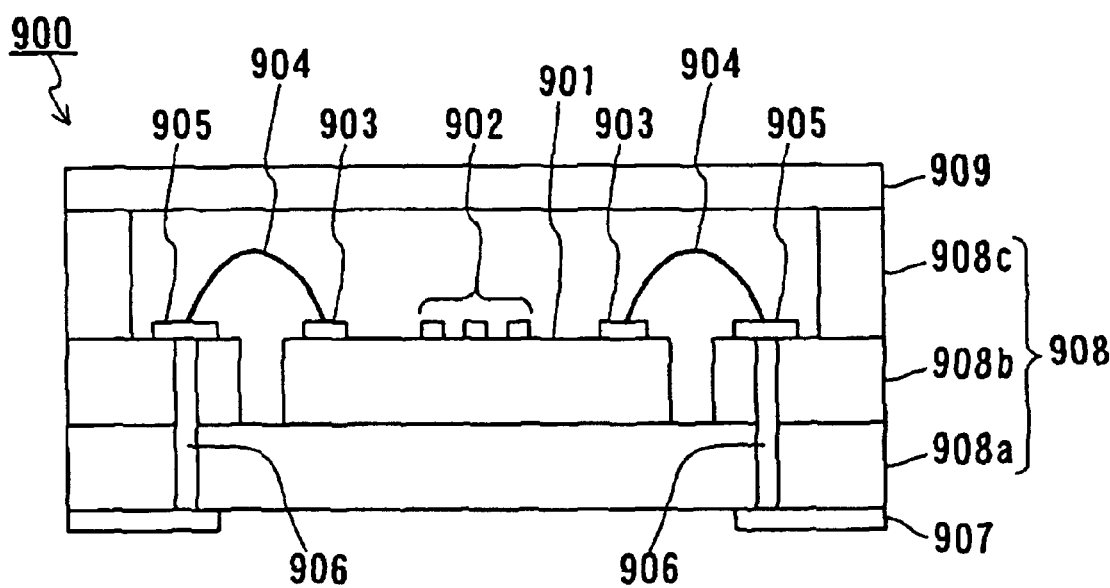
FIG. 38 is a cross-sectional view showing an example of a conventional SAW device.
Figure 39:
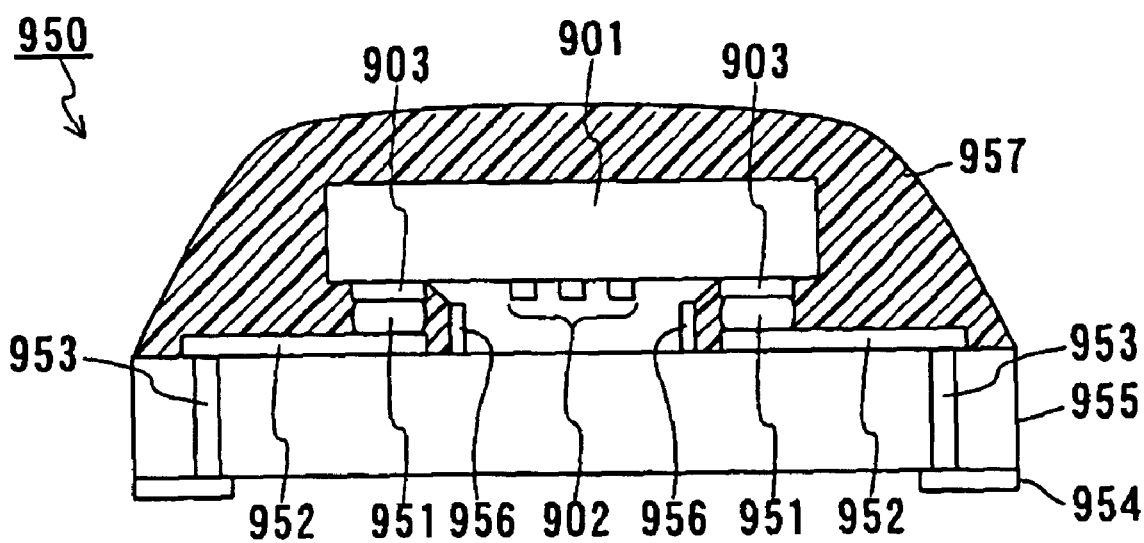
FIG. 39 is a cross-sectional view showing another example of the conventional SAW device.

In Embodiment 25, an example of a circuit module of the present invention will be described. FIG. 37 is a cross-sectional view of a circuit module 370 of Embodiment 25.

The circuit module 370 is different from the SAW device 300b described in Embodiment 18, in that the circuit module 370 is provided with circuit components 371. The circuit module 370 includes the circuit board 310, the space forming member 320b, the SAW element 301, the protective member 327, and the circuit components 371. The circuit board 310, the space forming member 320b, the SAW element 301, and the protective member 327 are the same as those described above. In FIG. 37, the solid filling 320z is not shown.

In the circuit module 370, the circuit components 371 are mounted on the wiring lines 312 in addition to the SAW element 301. The bumps of the circuit components 371 are buried in the space forming member 320b, and the circuit components 371 are fixed by the space forming member 320b. The bumps of the circuit components 371 are connected electrically to the wiring lines 312 via the solid filing 320z of the space forming member 320b. The space forming member 320 or 320a may be used in place of the space forming member 320b. In this case, the SAW element 301 and the circuit components 371 are mounted directly on the wiring lines 312. The circuit components 371 include functional elements, for example, a semiconductor device such as a diode switch, an amplifier, and a high-frequency IC, an inductor, a capacitor, a resistance element, and the like.

These circuit components 371 can be mounted on the wiring lines 312 by the same method as that for mounting the SAW element of the SAW device 300i on the wiring lines 312. It also may be possible that, after mounting the circuit components 371, the reverse surface of the piezoelectric substrate 11 and the reverse surface of the circuit components 371 are ground to make the piezoelectric substrate 11 and the circuit components 371 thin. This enables the circuit module 370 to be thinner.

In the circuit module 370 of Embodiment 25, the SAW element 301 and the circuit components 371 can be mounted on the circuit board 310 at high density. Therefore, in the circuit module 370, miniaturization and low cost can be realized.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A surface acoustic wave device, comprising:

a piezoelectric substrate;

a plurality of comb electrodes for exciting a surface acoustic wave, disposed on a principal plane of the piezoelectric substrate;

a plurality of bumps disposed on the principal plane; and
a member containing resin, disposed on the principal plane side,
wherein the bumps and the comb electrodes are connected electrically to each other, and at least a part of the bumps is buried in the member;
wherein the member is an insulating sheet,
the insulating sheet is disposed away from the comb electrodes, and
the bumps penetrate through the insulating sheet;
further comprising a side wall disposed between the piezoelectric substrate and the insulating sheet on a periphery of the comb electrodes,
wherein the piezoelectric substrate, the insulating sheet, and the side wall form a space, which allows the comb electrodes to vibrate, on the periphery of the comb electrodes;
further comprising a partition wall disposed between the comb electrodes and the side wall,
wherein the piezoelectric substrate, the insulating sheet, and the partition wall form, in the space, a second space that allows the comb electrodes to vibrate.

2. A surface acoustic wave device according to claim 1, wherein the second space is an enclosed space.

3. A method for producing a surface acoustic wave device, comprising the steps of:
(a) forming a plurality of comb electrodes for exciting a surface acoustic wave and bumps connected electrically to the comb electrodes on a principal plane of a piezoelectric substrate; and
(b) opposing the principal plane of the piezoelectric substrate to an insulating sheet, and bringing the piezoelectric substrate and the insulating sheet closer together so that the bumps penetrate through the insulating sheet;
further comprising the step of forming a side wall on the insulating sheet prior to the step (b),
wherein the step (b) includes opposing the principal plane of the piezoelectric substrate to the insulating sheet, and bringing the piezoelectric substrate and the insulating sheet closer together so that the bumps penetrate through the insulating sheet and so that the piezoelectric substrate, the insulating sheet, and the side wall form a space on a periphery of the comb electrodes, and
the space allows the comb electrodes to vibrate therein.

4. A method for producing a surface acoustic wave device according to claim 3, wherein the space is an enclosed space.

5. A method for producing a surface acoustic wave device according to claim 3, further comprising the step of forming a protective member so as to cover the side wall after the step (b).

6. A method for producing a surface acoustic wave device according to claim 3, further comprising the step of forming a side wall on the insulating sheet prior to the step (b),
wherein the step (b) includes opposing the principal plane of the piezoelectric substrate to the insulating sheet, and bringing the piezoelectric substrate and the insulating sheet closer together so that the bumps penetrate through the insulating sheet and the side wall and so that the piezoelectric substrate, the insulating sheet, and the side wall form a space on a periphery of the comb electrodes, and
the space allows the comb electrodes to vibrate therein.

7. A method for producing a surface acoustic wave device according to claim 3, wherein the insulating sheet is made of resin in a semi-cured state, and
in the step (b), the insulating sheet is heated to a temperature equal to or higher than a glass transition temperature of the resin.

8. A method for producing a surface acoustic wave device according to claim 3, wherein the step (a) further includes the step of forming a partition wall between the comb electrodes and the side wall on the principal plane,
in the step (b), the piezoelectric substrate and the insulating sheet are brought closer together so that the piezoelectric substrate, the insulating sheet, and the side wall form a second space on a periphery of the comb electrodes, and
the second space allows the comb electrodes to vibrate therein.

9. A method for producing a surface acoustic wave device, comprising the steps of:
(i) forming a piezoelectric substrate, a plurality of comb electrodes formed on a principal plane of the piezoelectric substrate, a surface acoustic wave element including a plurality of bumps connected electrically to the plurality of comb electrodes, and a circuit board having a principal plane on which wiring lines are formed;
(ii) disposing the principal plane of the piezoelectric substrate and the principal plane of the circuit board so that they are opposed to each other with a space forming member interposed therebetween; and
(iii) bringing the circuit board and the surface acoustic wave element closer together so that the bumps are buried in the space forming member to be connected electrically to the wiring lines,
wherein, in the step (iii), the space forming member forms a space allowing the comb electrodes to vibrate on a periphery of the comb electrodes;
wherein the bumps penetrate through the space forming member to be connected directly to the wiring lines in the step (iii);
wherein the bumps and the wiring lines are connected to each other by applying an ultrasonic wave to a contact point therebetween in the step (iii).

10. A circuit module comprising a circuit board, a surface acoustic wave device, and a functional element,
wherein the circuit board includes wiring lines formed on a principal plane thereof,
the surface acoustic wave device and the functional element are mounted on the wiring lines,
the surface acoustic wave device includes a piezoelectric substrate, a plurality of comb electrodes for exciting a surface acoustic wave disposed on a principal plane of the piezoelectric substrate, a plurality of bumps disposed on the principal plane of the piezoelectric substrate, and a member containing resin disposed on a side of the principal plane of the piezoelectric substrate,
the bumps and the comb electrodes are connected electrically to each other, and
at least a part of the bumps is buried in the member;
wherein the member is an insulating sheet,
the insulating sheet is disposed away from the comb electrodes, and
the bumps penetrate through the insulating sheet;
further comprising a side wall disposed between the piezoelectric substrate and the insulating sheet on a periphery of the comb electrodes,
wherein the piezoelectric substrate, the insulating sheet, and the side wall form a space, which allows the comb electrodes to vibrate, on the periphery of the comb electrodes;

further comprising a partition wall disposed between the comb electrodes and the side wall, wherein the piezoelectric substrate, the insulating sheet, and the partition wall form, in the space, a second space that allows the comb electrodes to vibrate.

11. A circuit module according to claim 10, wherein the functional element includes electrodes, and the electrodes of the functional element penetrate through the space forming member to be connected to the wiring lines.

12. A circuit module according to claim 10, wherein the circuit board includes a plurality of wiring lines formed in a layef layered shape and via electrodes for connecting the plurality of wiring lines.

13. A circuit module according to claim 10, wherein the second space is an enclosed space.

14. A surface acoustic wave device, comprising:

a piezoelectric substrate;

a plurality of comb electrodes for exciting a surface acoustic wave, disposed on a principal plane of the piezoelectric substrate;

a plurality of bumps disposed on the principal plane; and a member containing resin, disposed on the principal plane side, wherein the bumps and the comb electrodes are connected electrically to each other, and at least a part of the bumps is buried in the member;

wherein the member is an insulating sheet, the insulating sheet is disposed away from the comb electrodes, and the bumps penetrate through the insulating sheet;

further comprising a side wall disposed between the piezoelectric substrate and the insulating sheet on a periphery of the comb electrodes, wherein the piezoelectric substrate, the insulating sheet, and the wall form a space, which allows the comb electrodes to vibrate, on the periphery of the comb electrodes;

further comprising a partition wall disposed between the comb electrodes and the side wall and a roof member disposed between the piezoelectric substrate and the insulating sheet, wherein the piezoelectric substrate, the partition wall, and the roof member form, in the space, a second space that allows the comb electrodes to vibrate.

15. A surface acoustic wave device, comprising:

a piezoelectric substrate;

a plurality of comb electrodes for exciting a surface acoustic wave, disposed on a principal plane of the piezoelectric substrate;

a plurality of bumps disposed on the principal plane; and a member containing resin, disposed on the principal plane side, wherein the bumps and the comb electrodes are connected electrically to each other, and at least a part of the bumps is buried in the member;

wherein the member is an insulating sheet, the insulating sheet is disposed away from the comb electrodes, and the bumps penetrate through the insulating sheet;

further comprising electrode terminals formed on a principal plane of the insulating sheet on an opposite side of the piezoelectric substrate.

16. A surface acoustic wave device according to claim 15, wherein the insulating sheet contains a solid filling having conductivity, and the electrode terminals and the bumps are connected electrically to each other via the solid filling.

17. A surface acoustic wave device, comprising:

a piezoelectric substrate;

a plurality of comb electrodes for exciting a surface acoustic wave, disposed on a principal plane of the piezoelectric substrate;

a plurality of bumps disposed on the principal plane; and a member containing resin, disposed on the principal plane side, wherein the bumps and the comb electrodes are connected electrically to each other, and at least a part of the bumps is buried in the member;

further comprising a circuit board disposed so as to be opposed to the principal plane of the piezoelectric substrate, wherein the circuit board includes wiring lines formed on a surface on the piezoelectric substrate side, the member is disposed between the piezoelectric substrate and the circuit board, and the member is a space forming member for forming a space, which allows the comb electrodes to vibrate, on a periphery of the comb electrodes, wherein the space forming member is provided with a concave portion for forming the space.

18. A method for producing a surface acoustic wave device, comprising the steps of:

(a) forming a plurality of comb electrodes for exciting a surface acoustic wave and bumps connected electrically to the comb electrodes on a principal plane of a piezoelectric substrate; and (b) opposing the principal plane of the piezoelectric substrate to an insulating sheet, and bringing the piezoelectric substrate and the insulating sheet closer together so that the bumps penetrate through the insulating sheet;

wherein the step (a) includes forming a partition wall and a roof member to be a cover of the partition wall on a periphery of the comb electrodes so as to form a space that allows the comb electrodes to vibrate therein.

19. A method for producing a surface acoustic wave device, comprising the steps of:

(a) forming a plurality of comb electrodes for exciting a surface acoustic wave and bumps connected electrically to the comb electrodes on a principal plane of a piezoelectric substrate; and (b) opposing the principal plane of the piezoelectric substrate to an insulating sheet, and bringing the piezoelectric substrate and the insulating sheet closer together so that the bumps penetrate through the insulating sheet; wherein the step (a) includes forming a side wall on a periphery of the comb electrodes on the principal plane, the step (b) includes opposing the principal plane of the piezoelectric substrate to the insulating sheet and bringing the piezoelectric substrate and the insulating sheet closer together so that the bumps penetrate through the insulating sheet and so that the piezoelectric substrate, the insulating sheet, and the side wall form a space on a periphery of the comb electrodes, and the space allows the comb electrodes to vibrate therein.

20. A method for producing a surface acoustic wave device according to claim 19, wherein the space is an enclosed space.

21. A method for producing a surface acoustic wave device, comprising the steps of:
  (a) forming a plurality of comb electrodes for exciting a surface acoustic wave and bumps connected electrically to the comb electrodes on a principal plane of a piezoelectric substrate; and
  (b) opposing the principal plane of the piezoelectric substrate to an insulating sheet, and bringing the piezoelectric substrate and the insulating sheet closer together so that the bumps penetrate through the insulating sheet;
  wherein the bumps are allowed to penetrate through the insulating sheet under application of an ultrasonic wave to the insulating sheet in the step (b).

22. A method for producing a surface acoustic wave device, comprising the steps of:
  (i) forming a piezoelectric substrate, a plurality of comb electrodes formed on a principal plane of the piezoelectric substrate, a surface acoustic wave element including a plurality of bumps connected electrically to the plurality of comb electrodes, and a circuit board having a principal plane on which wiring lines are formed;
  (ii) disposing the principal plane of the piezoelectric substrate and the principal plane of the circuit board so that they are opposed to each other with a space forming member interposed therebetween; and
  (iii) bringing the circuit board and the surface acoustic wave element closer together so that the bumps are buried in the space forming member to be connected electrically to the wiring lines,
  wherein, in the step (iii), the space forming member forms a space allowing the comb electrodes to vibrate on a periphery of the comb electrodes;
  wherein the space forming member is provided with a concave portion for forming the space.

23. A method for producing a surface acoustic wave device, comprising the steps of:
  (i) forming a piezoelectric substrate, a plurality of comb electrodes formed on a principal plane of the piezoelectric substrate, a surface acoustic wave element including a plurality of bumps connected electrically to the plurality of comb electrodes, and a circuit board having a principal plane on which wiring lines are formed;
  (ii) disposing the principal plane of the piezoelectric substrate and the principal plane of the circuit board so that they are opposed to each other with a space forming member interposed therebetween; and
  (iii) bringing the circuit board and the surface acoustic wave element closer together so that the bumps are buried in the space forming member to be connected electrically to the wiring lines,
  wherein, in the step (iii), the space forming member forms a space allowing the comb electrodes to vibrate on a periphery of the comb electrodes; wherein the step (i) includes crimping the space forming member onto the wiring lines by heating, and further heating the space forming member.

24. A circuit module comprising a circuit board, a surface acoustic wave device, and a functional element,
  wherein the circuit board includes wiring lines formed on a principal plane thereof,
  the surface acoustic wave device and the functional element are mounted on the wiring lines,
  the surface acoustic wave device includes a piezoelectric substrate, a plurality of comb electrodes for exciting a surface acoustic wave disposed on a principal plane of the piezoelectric substrate, a plurality of bumps disposed on the principal plane of the piezoelectric substrate, and a member containing resin disposed on a side of the principal plane of the piezoelectric substrate,
  the bumps and the comb electrodes are connected electrically to each other, and
  at least a part of the bumps is buried in the member;
  wherein the member is an insulating sheet,
  the insulating sheet is disposed away from the comb electrodes, and the bumps penetrate through the insulating sheet;
  further comprising a side wall disposed between the piezoelectric substrate and the insulating sheet on a periphery of the comb electrodes,
  wherein the piezoelectric substrate, the insulating sheet, and the side wall form a space, which allows the comb electrodes to vibrate, on the periphery of the comb electrodes;
  further comprising a partition wall disposed between the comb electrodes and the side wall and a roof member disposed between the piezoelectric substrate and the insulating sheet,
  wherein the piezoelectric substrate, the partition wall, and the roof member form, in the space, a second space that allows the comb electrodes to vibrate.

25. A circuit module according to claim 24, wherein the functional element includes electrodes, and the electrodes of the functional element penetrate through the member containing resin to be connected to the wiring lines.

26. A circuit module according to claim 24, wherein the circuit board includes a plurality of wiring lines formed in a layered shape and via electrodes for connecting the plurality of wiring lines.

27. A circuit module comprising a circuit board, a surface acoustic wave device, and a functional element,
  wherein the circuit board includes wiring lines formed on a principal plane thereof,
  the surface acoustic wave device and the functional element are mounted on the wiring lines,
  the surface acoustic wave device includes a piezoelectric substrate, a plurality of comb electrodes for exciting a surface acoustic wave disposed on a principal plane of the piezoelectric substrate, a plurality of bumps disposed on the principal plane of the piezoelectric substrate, and a member containing resin disposed on a side of the principal plane of the piezoelectric substrate,
  the bumps and the comb electrodes are connected electrically to each other, and
  at least a part of the bumps is buried in the member;
  wherein the member is an insulating sheet,
  the insulating sheet is disposed away from the comb electrodes, and
  the bumps penetrate through the insulating sheet;
  further comprising electrode terminals formed on a principal plane of the insulating sheet on an opposite side of the piezoelectric substrate,
  wherein the electrode termincals are connected electrically to the bumps.

28. A surface acoustic wave device according to claim 27, wherein the insulating sheet contains a solid filling having conductivity, and the electrode terminals and the bumps are connected electrically to each other via the solid filling.

29. A circuit module according to claim 27, wherein the functional element includes electrodes, and the electrodes of the functional element penetrate through the member containing resin to be connected to the wiring lines.

30. A circuit module according to claim 27, wherein the circuit board includes a plurality of wiring lines formed in a layered shape and via electrodes for connecting the plurality of wiring lines.

31. A circuit module comprising a circuit board, a surface acoustic wave device, and a functional element,
   wherein the circuit board includes wiring lines formed on a principal plane thereof,
   the surface acoustic wave device and the functional element are mounted on the wiring lines,
   the surface acoustic wave device includes a piezoelectric substrate, a plurality of comb electrodes for exciting a surface acoustic wave disposed on a principal plane of the piezoelectric substrate, a plurality of bumps disposed on the principal plane of the piezoelectric substrate, and a member containing resin disposed on a side of the principal plane of the piezoelectric substrate,
   the bumps and the comb electrodes are connected electrically to each other, and at least a part of the bumps is buried in the member;
   the member is disposed between the piezoelectric substrate and the circuit board, and
   the member is a space forming member for forming a space, which allows the comb electrodes to vibrate, on a periphery of the comb electrodes,
   wherein the space forming member is provided with a concave portion for forming the space.

32. A circuit module according to claim 31, wherein the functional element includes electrodes, and the electrodes of the functional element penetrate through the space forming member to be connected to the wiring lines.

33. A circuit module according to claim 31, wherein the circuit board includes a plurality of wiring lines formed in a layered shape and via electrodes for connecting the plurality of wiring lines.

* * * * *

UNITED STATES PATENT AND TRADEMARK OFFICE
CERTIFICATE OF CORRECTION

PATENT NO. : 6,710,682 B2
DATED : March 23, 2004
INVENTOR(S) : Onishi et al.

It is certified that error appears in the above-identified patent and that said Letters Patent is hereby corrected as shown below:

Title page,
Item [75], Inventors, "Akihiro Nanba" should read -- Akihiko Namba --

Column 29,
Line 12, "layef layered shape" should read -- layered shape --

Column 32,
Line 62, "electrode termincals" should read -- electrode terminals --

Signed and Sealed this

Thirtieth Day of November, 2004

JON W. DUDAS
*Director of the United States Patent and Trademark Office*